United States Patent [19]
Heimlich et al.

[11] Patent Number: 5,903,886
[45] Date of Patent: May 11, 1999

[54] HIERARCHICAL ADAPTIVE STATE MACHINE FOR EMULATING AND AUGMENTING SOFTWARE

[75] Inventors: Michael C. Heimlich, Londonderry; Kenneth R. St. Hilaire, Hollis, both of N.H.

[73] Assignee: Smartlynx, Inc., Londonderry, N.H.

[21] Appl. No.: 08/841,195

[22] Filed: Apr. 29, 1997

Related U.S. Application Data

[60] Provisional application No. 60/017,125, Apr. 30, 1996.

[51] Int. Cl.$^6$ ....................................................... G06F 15/18
[52] U.S. Cl. ................................................................ 706/50
[58] Field of Search ................................. 706/50, 52, 42; 364/488

[56] References Cited

U.S. PATENT DOCUMENTS

| | | |
|---|---|---|
| 4,922,432 | 5/1990 | Kobayashi et al. . |
| 5,187,668 | 2/1993 | Okude et al. . |
| 5,253,330 | 10/1993 | Ramacher et al. ........................ 706/42 |
| 5,258,919 | 11/1993 | Yamanouchi et al. . |
| 5,371,683 | 12/1994 | Fukazawa et al. . |
| 5,468,977 | 11/1995 | Machida . |
| 5,487,018 | 1/1996 | Loos et al. . |
| 5,515,454 | 5/1996 | Buckley .................................. 382/157 |
| 5,566,080 | 10/1996 | Yokoi . |
| 5,673,198 | 9/1997 | Lawman et al. ........................ 364/489 |

OTHER PUBLICATIONS

Tsu–Chang Lee & Jason Cong, "The New Line in IC Design", IEEE Spectrum, Mar. 1997, pp. 52–58.

*Primary Examiner*—Allen R. MacDonald
*Assistant Examiner*—Sanjiv Shah
*Attorney, Agent, or Firm*—Scott J. Asmus; Vernon C. Maine

[57] ABSTRACT

The present invention defines a method for emulating an iterated process represented by a series of related tasks and a control mechanism that monitors and enables the iterative execution of those tasks until data associated with the process converges to predetermined goals or objectives. The invention defines a method in which fuzzy neural networks and discreet algorithms are applied to perform the process tasks and in which configurable, reloadable finite state machines are applied to control the execution of those tasks. In particular, the present invention provides a method for emulating the process of designing integrated circuit (IC) applications and printed circuit board (PCB) applications for the purpose of simulating, emulating, analyzing, optimizing and predicting the behavioral and physical characteristics of the application at the earliest possible stage of the process. The invention applies fuzzy neural networks and configurable, reloadable finite state machines to emulate the IC or PCB design process, enabling the invention to emulate the the computer aided design (CAD) tools used to perform the design process tasks as well as the individuals using those tools. By emulating the combination of man and machine performances, the invention can more accurately predict the results of a given task than tools that consider only the machine element. The invention also provides a means to adapt the performance and behavior of any element of the invention using historical data compiled from previous design or manufacturing experiences, allowing the invention to incorporate the knowledge gained from previous designs into current designs.

11 Claims, 14 Drawing Sheets

HIERARCHICAL ADAPTIVE STATE MACHINE FOR EMULATING AND AUGMENTING SOFTWARE

This application is a continuation to pending provisional U.S. application Ser. No. 60/017,125 by the same applicants, filed Apr. 30, 1996.

BACKGROUND OF THE INVENTION

1. Technical Field of the Invention

This invention most generally relates to software tools, packages, programs and algorithms used for predicting the outcome and assisting in the performance of a given task or sequence of tasks, by emulating the task or sequence of tasks. In particular, it relates to analytical tools used in the process of designing the hardware and software components of an integrated circuit or printed circuit board.

2. Background Art

The current design process for creating integrated circuit (IC) production designs for digital circuits is linear in the sense that there is little concurrence among or iteration of the constituent steps. The process is executed one step at a time. The final step evaluates and verifies the quality of the design. If the design does not meet design goals and manufacturing criteria, then the process is iterated either in its entirety or at the latest possible step.

At a very high level, the process proceeds according to FIG. 1, where Element A, "capture", represents the step or phase where schematic or language-based electrical functionality VHDL/Verilog) is captured and electrically simulated at the functional block or cell level, showing block/cell properties and interconnects. Element B, "synthesis", represents the next step or phase where the "register transfer level" (RTL) logical implementation of each block or cell is created.

Element C, "floorplan/placement", represents the step or phase where blocks/cells are physically implemented and maneuvered relative to each other within an outline drawing representation of the IC. Element D, "routing", represents the next step or phase where interconnects are physically implemented, based on floorplan/placement data and other specified constraints.

Element E, "analysis", represents the step where electrical properties are extracted from the physical design and compared to block/cell properties and assumptions or constraints adopted in previous steps. Element F, "tape out", represents the step or phase where agreement between logical and physical design is verified, and the data converted to a format compatible with the user's IC manufacturing capability.

Expanding further on the conventional process of FIG. 1, we examine the first step in the process called capture. In this step, the design is first captured as electrical components and wires displayed schematically or as a "blue print". This is a logical or conceptual representation of the IC, rather than a physical design, which shows the various subsections of the design (cells and/or blocks), annotates or describes various properties of theses subsections (for documentation purposes or for subsequent steps in the design process), and the electrical connections which will be formed (routed) between subsections. The capture phase includes the use of many simulation tools to help predict parametric, functional, and/or behavioral IC performance.

As the cells and blocks are added to the schematic and individually instantiated and annotated, nets are added which tie the various pins of the cells/blocks to each other or to pads (inputs/outputs of the chip itself).

The second step of the process is also part of the logical design phase. Synthesis is the taking of the high level representation of the circuit and transforming it into a lower level which is optimized for any of several criteria, such as speed or size. The lower level is usually referred to as RTL, or register transfer level. Synthesis tools attempt to fully automate the generation of the lower level description from the higher level description.

These first two steps comprise the logical phase of the design process. There is no direct link in this phase to anything which is actually manufactured. Extensive simulation of the logical design is performed against important electrical, thermal, and other parametric, functional, or behavioral criteria.

Placement is the first step which involves physical realization of the design. The various components captured and synthesized are placed as cells and blocks relative to each other and the pads. Placement optimizes the positioning of each cell/block to reduce chip size and to meet thermal and routing constraints.

Routing is the final step of the physical realization phase. Whereas placement corresponded to the placing of blocks/cells on the schematic, routing is the realization of the nets. Routing is also constrained by criteria such as type of route (power, ground, signal rip) and the criticality of a route. Insufficient or excessive room on the chip for a complete routing usually requires iteration of the placement step. Routing software automates the generation of routes based on constraints defined by all previous steps of the design process.

After the physical design is fully realized, it is analyzed to make certain that it matches logical, simulated performance. The analysis can also be used to validate any assumptions made during any previous phase of the entire design process. Unsatisfactory analysis results require the further iteration of one or all design steps. Successful analysis leads to final verification and then to tape out for manufacturing.

The major problem with the conventional design methodology is that information essential to a successful, single (first) pass design is usually not available to the logical designer until much later in the design process. Simply stated, the design process can not be fully captured logically without first realizing it physically. In practice, the analysis step reveals that various design objectives and assumptions had to be violated to get a realizable design; the design does not fully comply with the original goals or specifications. All or part of the design process must be repeated to modify the current design so that it is both physically realizable and specifically compliant.

An example of this maybe found in the myriad of Intel® Pentium® chips on the market, where we consider the design goal as the clock frequency. As the design process is completed, it is clear that the chip will work at a frequency less than that specified as the goal. While the chip is still manufactured and sold it can be used as the basis for a new design which may achieve the original frequency goal. While these derivative products often contribute to the product line revenue stream, a single iteration of a 100 person design team for a three month period can add millions of dollars to a project in direct labor costs. Lost market share because of late product entry can cost many times more.

This problem becomes much more acute with deep submicron (DSM) manufacturing technology. The smaller the features on an IC, the greater the number of cells/blocks and their complexity which can be added. Furthermore, smaller transistors correspond to faster transistors, albeit at a rate of diminishing returns.

The combination of more and faster transistors leads to a shift in how to calculate the time it takes an electrical input signal to manifest itself as an output. In pre-DSM designs, this input-output time, or delay, was calculated by adding up the number of transistors the signal went through and then adding a margin to account for the interconnects connecting the transistors. Interconnect delay dominates this equation in DSM designs, thus making it necessary to get through the routing step of the design (i.e. completing the entire design) process before the designer can determine the interconnect delay of any given net. The predominance of interconnect issues make it that much more difficult to fully appreciate the design without going through the routing step.

There is this notion, then, of uncertainty in the design. Engineers traditionally build in margin to account for these unknowns. In very aggressive manufacturing technologies, such margins cut into the performance enhancement offered by manufacturing but left unrealized by the design. Interconnect delay has been treated as something which was not necessarily considered fully, but rather something for which you built in margin.

Power dissipation is a similar concern and its consideration at each step of the design process is essential to a DSM design with minimal iteration. At a higher level, designers would also like to make similar trade-offs between what should be in hardware, software, and firmware as well as hardware architectures. All of these design considerations require constraints at early design steps based on limited information as to the results of latter steps.

Exacerbating these problems is the fact that no one person can perform and excel at the entire design process. Thus, two subgroups have arisen out of the design team—logical (circuit) engineers and physical (design) engineers. This division potentially impedes the design flow because of data transfer issues as well as those associated with group dynamics.

SUMMARY OF THE INVENTION

The parent application describes the particular problem of interconnect delay calculation for ICs and a solution which upon further analysis and development is herein extended.

What is needed, then, is a software tool which, at the earliest stages of the design process, allows the designer to accurately and quickly make design decisions based on detailed predictive knowledge of how the latter steps of the process will react to these decisions and what these latter steps will produce. If the logical designer, for example, can make a design decision and see some level of detail of what the routing step will produce based on this decision, than design iterations can be avoided by effectively realizing the physical design during the logical design phase.

This solution can be abstracted to any process composed of a series of dependent tasks where many or all of the tasks are completed through the combination of an individual making decisions with the assistance of a computer or other types of machine automation. In these processes, the entire process (or significant fractions of it) must be iterated to meet the process objectives because of lack of knowledge in the early tasks of the process which can only be known in sufficient detail after tasks are completed later in the process. The solution here is identical to that for the IC design example: provide a software tool which can take the information available in the early task(s), evaluate what the impact will be should the latter task(s) be performed, and provide the required information in the context of the current task. The evaluation of the latter task(s) during the earlier task(s) is carried out by the software tool emulating the performance of the individual using the (computer or machine) automation, and is referred to as man/machine emulation (MME) because it can accurately reproduce the output for a given set of inputs that the combination of man and machine would produce if actually performing the task (FIG. 10).

The software tool for any given task or subtask can be derived directly from previous, successful examples of the completion of that task or subtask whether the examples are completed as part of an actual design or as part of a contrived experiment solely for the purpose of creating enough examples. The inputs to the given task or subtask and the related outputs represent a mapping which can be defined as a function which successfully creates the outputs from the corresponding inputs for that task or subtask. Because the function is the MME, it is not easily represented as a mathematical algorithm which can be coded in computer software. Instead, the representative function is embedded in the examples and the software tool must be able to interpolate and extrapolate from these examples to perform the MME for subsequent instances of the process. The MME is taught how to respond to future conditions based on historical data, and learns to respond to new conditions. It learns how to respond to new conditions by extrapolating and interpolating the historical data and formulating a solution.

This software tool which is the MME for a task or subtask is referred to as a virtual tool because to the observer outside the task or subtask, it should not be possible to discern the software tool from the actual man/machine combination performing the task. In FIG. 10, if X=X' and Y=Y' then the MME accurately emulates the task and so far as the realization of Y from X, the observer can not discern the difference between the actual and emulated task. Furthermore, the method of creating a virtual tool and the architecture which allows for the arrangement of virtual tools into the emulation of the process, fractional portions of the process, tasks, and/or subtasks should be identical for any and all MMEs into which the process is decomposed.

A simplified example of the broad scope of the invention may be useful to illustrate the MME concepts presented in the preceding paragraphs. Suppose a used car dealer wants to determine whether buying a given vehicle will provide a profit to the dealer. The dealer must evaluate the physical condition of the vehicle, the age of the vehicle, and other easily quantified parameters. The dealer must also consider other factors not so easily quantified, such as the expertise of the dealer's sales force, and the season of the year. A very slick salesman may be better able to sell an otherwise undesirable vehicle at a higher profit than a less experienced (or more honest) salesman. Likewise, a convertible sports car is more likely to provide a better profit in the spring or summer months, while a four-wheel drive vehicle is more likely to provide a better profit in the fall or winter months. Therefore, for the dealer to make the best decision regarding the purchase of a given vehicle, the dealer must consider both quantitative and qualitative factors. The dealer's decision process can be modeled as an MME, whereby the results of the process are expressed as a combination of the tools used to calculate the value of the vehicle, and of the dealer's instincts and understanding of the qualitative factors that affect the profitability of a given vehicle. Historical data could be compiled from the dealer's previous vehicle purchases and subsequent sales profitability, and the MME representing the dealer's decision process could incorporate this data into future decisions thereby improving each decision over time and thus improving the dealer's profitability.

The goal of the invention in the most general sense is to provide a software methodology and architecture which can achieve MME for a process or subset of a process by the hierarchical arrangement of virtual tools which are themselves comprised of 1 or more MMEs of lower level tasks of the process, and in this way allow any or all earlier steps in the process to get the information they need from latter steps in the process through MME rather than the actual performance of the latter tasks.

More specifically, and in its initial application to IC physical design, a goal of the invention is to redress the imbalance between gate and interconnect delay caused by the shift to DSM. This adjustment should bring the DSM design into a regime commensurate with designs using much less aggressive manufacturing technologies in which the number of design iterations is reduced because of less discrepancy between simulation and analysis.

A further goal of the invention is to go beyond "redressing" the balance and actually predict interconnect delays associated with preliminary design decisions by emulating the placement and routing of the design, extracting the properties of the interconnects, and providing the associated information prior to actually performing these latter tasks of the process.

The invention extends to the earliest state of the design, capture. As cells or blocks are placed and nets created on the schematic, the invention annotates the pins of the cell or block and the nets with delay values corresponding to the interconnect delay. An enhanced embodiment provides data on crosstalk between interconnects, noise on interconnects, power dissipated by cells/blocks, the overall size of the IC design, similar information for the IC package and the printed circuit board, and lines of code for software and firmware of the overall system.

The inner workings of the initial application of the invention proceed in five stages. The schematic information is first parsed into a format useful to the core invention. Second, information on the nets, cells or blocks, the chip design goals, and the manufacturing technology are used to create an emulated placement using a virtual tool representative of the man/machine combination which will be performing the actual placement. A collection, or ensemble, of these possible, or pseudo-placements is used to come up with the most likely placement given the design goals and constraints. Third, the schematic and pseudo-placement data are used as the input for a second virtual tool which is used to create an emulated collection of pseudo routes of the interconnect for which the delay is being calculated based on the man/machine combination which will be performing the actual routing.

The output of this stage, the routing channels traversed by this particular interconnect, is then fed into a final virtual tool which calculates the delay based on the man/machine combination which will be performing the actual analysis. The fifth and final stage of the invention takes the delay value and puts it on the schematic.

A wide range of embodiments are possible, incorporating multiple enhancements to the initial application of the invention. The delay calculation can be refined so that it becomes more than "redressing" to the stage where it actually predicts the delay. The invention can also calculate other interconnect-related data, like cross-talk between interconnects and noise on a particular set of interconnects. Other performance aspects of the design can be similarly provided based on the emulation, such as IC die size and power dissipation. Emulation of the IC packaging, the printed circuit board design, application software, firmware, and mechanical considerations can also be included with availability of the appropriate virtual tools and MMEs. Tuning parameters available to the user may allow the accuracy of the invention to be traded off against the its operational speed.

The invention can also output the pseudo-placement, pseudo-routing, or any other output information from a virtual tool in acceptable data formats for use in later phases of the design process.

A significant capability of the invention is the ability to represent any hierarchical process as a series of virtual tools. The invention assists the user in creating MMEs from the input/output data representative of the task to be emulated. The invention also assists the user in the definition of the process as an arbitrary arrangement of virtual tools into the subtasks, tasks, and process to be emulated. Furthermore, there is a facility for the user to have a virtual tool be a traditional piece of software, such as an algorithm, rather than MMEs Still other objects and advantages of the present invention will become readily apparent to those skilled in this art from the following detailed description, wherein we have shown and described only a preferred embodiment of the invention, simply by way of illustration of the best mode contemplated by us on carrying out our invention.

DESCRIPTION OF THE PREFERRED EMBODIMENT

To those skilled in the art, the invention admits of many variations. The description of a preferred embodiment follows.

The invention is a software tool used in combination with conventional computer hardware and software, consisting of software components and data modules which when combined provide the ability to predict, to some degree of accuracy, the subsequent results of given process given the current state of the result of the process. In the case of the IC design example, this would mean predicting the physical properties of a production design for an integrated circuit, given the current state of its logical design. The invention is fundamentally a unitary, systematized embodiment of a hierarchical process, composed of any arbitrary arrangement of tasks with iterative feedback mechanisms and learning capabilities which tie the task functionality into a seamless, front-end accessible, self-teaching emulation of the remainder of the process itself.

Figure 9:
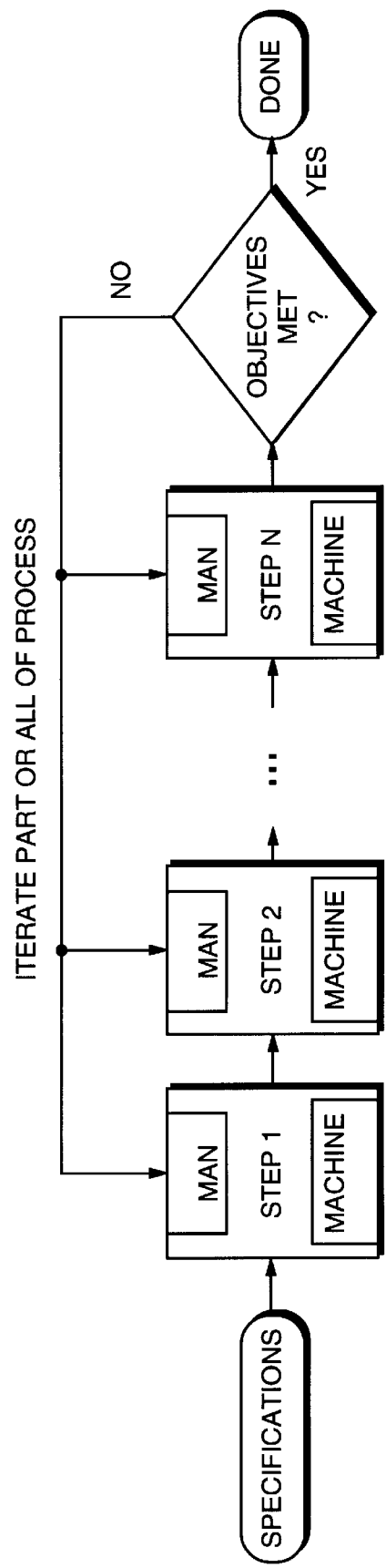
FIG. 9 is a block diagram illustrating a generic iterated process of man/machine tasks.

Stated most basically, the invention emulates and learns from the execution of the process of FIG. 9 in a vastly more efficient manner than actually iterating the process with people and material, with a lesser degree of expert inputs and a self-learning capability. Several software components of the invention are comprised of fuzzy neural nets, and are therefore, capable of being trained after the initial installation or fabrication of the invention. As such, the invention has two basic functional states: operation and training.

The operation state corresponds to that use for which the invention is intended, as evidenced in the above description. The training state corresponds to one in which information provided by the user in the form of previous examples of task inputs and corresponding outputs and/or expert knowledge is captured in an ergonomic format and used to alter and/or enhance the performance of the invention with regard to the goals of user.

Referring back to FIG. 9, the generic process flow example, the process can be decomposed into an arbitrary arrangement of tasks, Element Step 1, Element Step2, etc. up through a determinant number of arbitrarily arranged steps to Element Step N.. Each task represents an elementary unit of work for which inputs and outputs are clearly defined and are finite and manageable in terms of their number and ease of representation in the normal course of the task. Each task is performed through a combined effort between human effort, Element man in Element Step 1, Element Step 2, etc., and machine automation, Element machine in Element Step 1, Element Step 2, etc. The process is initiated by providing a set of inputs, Element Specifications, which articulate the criteria against which completion of the tasks of the process is evaluated, in Element Objectives Met?, upon its conclusion. Failure to meet the objectives leads to an iteration of the process in part or its entirety by using the current outputs and the evaluation of these outputs against the criteria as inputs to the process tasks. Once the criteria are met, the process is completed, Element Done.

Figure 10A:
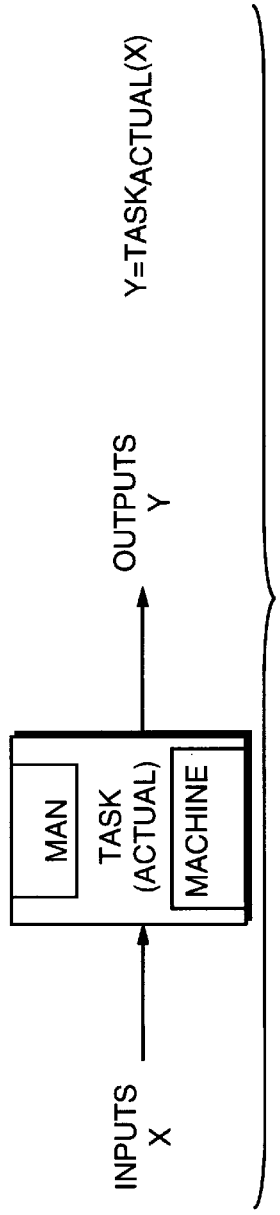
FIG. 10A is a block diagram illustrating an actual task function transfer relating inputs to outputs.

As shown in FIG. 10a, the purpose of the task in a process is such as to perform a unit transformation from the Inputs X to the Outputs, Y. Element Task (actual) refers to the process by which the task is performed. Element man and Element machine represent constituent components, human effort and machine automation, respectively, of the task such that the combination of the human effort under the guidance or with the assistance of some machine automation is able to successfully complete the task against some specified criteria. The actual performance of the task can be represented mathematically as the transformation of Inputs X to Outputs Y by the performance of the task, $$Y=Task_{actual}(X).$$

A simple example of this type of task would be timing the heating of an oven in which the inputs are the temperature and contents of the oven as represented by its thermal properties, the output is the time for the oven to heat to the temperature, the man is the person performing the task, and the machine is the oven and clock. The transform for the task is purely mathematical in that the time can be determined from the thermal properties of the contents for a given oven. If this mathematical transform is derived totally by an observation of many examples of the task actually being performed and it is then desirable to find the Outputs Y for a given Inputs X, to the degree of accuracy that the transform, Inputs X, and Outputs Y are known, it should not be distinguishable whether the Outputs Y were found from the Inputs X by performing the actual task or by using the transform, then the transform can be said to accurately represent, or model, the actual task without knowing how or by what means the actual task is performed. This emulation of the actual man/machine task by the mathematical transform derived from observations of the man/machine task, FIG. 10b, can be represented mathematically as the transformation of Inputs X to Outputs Y by the performing the transform for the emulation, $$Y=Task_{MME}(X).$$

Furthermore, for the purpose of predicting, emulating, simulating, or analyzing the process in terms of its inputs and outputs, the MME transform can not be distinguished from the performance of the actual task and can serve in its stead for such purposes.

Figure 10B:
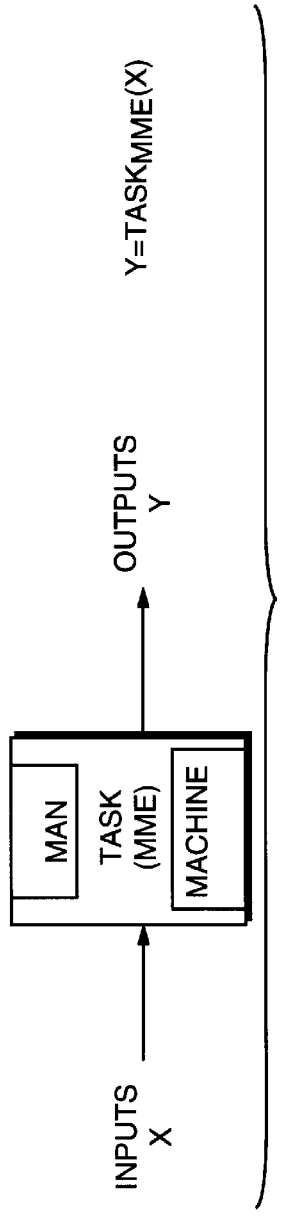
FIG. 10B is a block diagram illustrating a man/machine emulation of the process of FIG. 10A.

Still referring to FIG. 10b, Element Task (MME) refers to the mathematical transform representative of the actual task (FIG. 10a, Element Task (actual), and derived from observed instances of Inputs X and Outputs Y. Element man and Element machine represent constituent components, human effort and machine automation, respectively, of the actual task such that the MME transform mimics the combination of the human effort under the guidance or with the assistance of some machine.

Figure 10C:
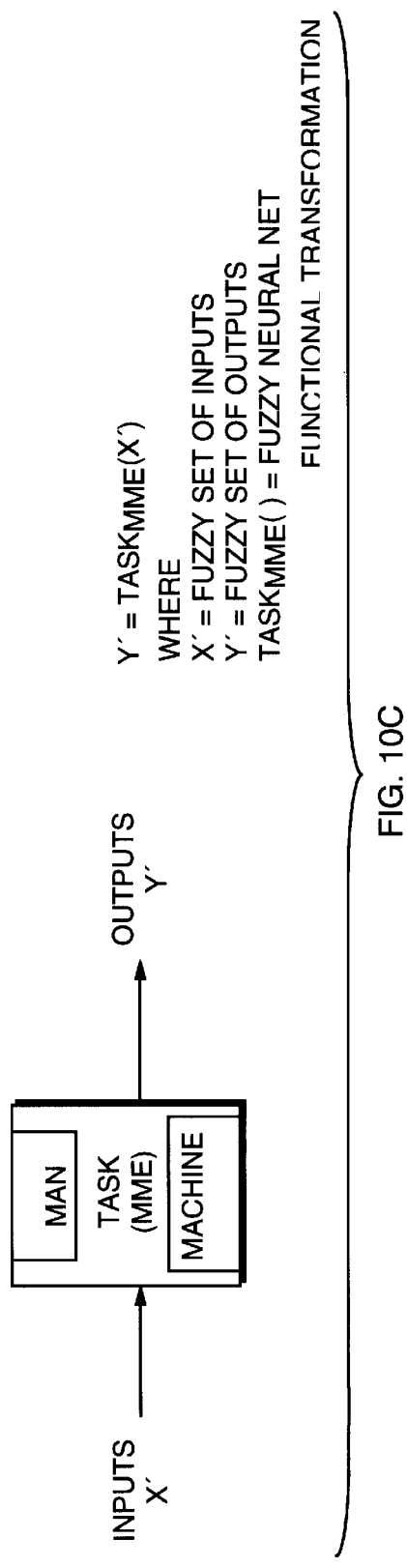

But in most instances, the inputs, outputs, and transform representing the task will include symbols, symbolic notations, heuristics, or non-quantifiable representations. These non-quantifiable representations, once mapped to a mathematical fuzzy set, can be treated as numeric and the transform for the derived task. Referring now to FIG. 10c, a similar actual task to the one illustrated in FIG. 10b may include Inputs X' and/or Outputs Y' which correspond to a fuzzy set of inputs or outputs. The transform corresponding to the MME for such a task can be represented mathematically as $$Y'=Task_{MME}(X')$$

And again will be indistinguishable from performing the actual task if the transform is derived under similar conditions as that in FIG. 10b, with the exception of the inputs and/or outputs containing fuzz sets.

This derived transform is the embodiment of the MME for a given task (FIGS. 10b and 10c). Granularity, or number, of tasks into which a process is decomposed is directly related to the limitations in the technique chosen to derive the transformation per the quantity and complexity, for fuzzy sets, of the inputs.

Still referring to FIG. 10c, Inputs X' and Outputs Y' are functionally identical to Inputs X and Outputs Y of FIGS. 10a and 10b; however, Inputs X' and Outputs Y' may contain fuzzy sets. As such, Element Task (MME) would than be a fuzzy transform, rather than a purely numerical one. Whether Inputs X' and/or Outputs Y' contain fuzzy sets or not, the fuzzy transform of Element Task (MME) can be derived using such methods as fuzzy-neural net based model free estimation or functional approximation, rather than the purely numerical or analytical techniques which would be used to derive the Element Task (MME) transform of FIG. 10b.

Figure 11A:
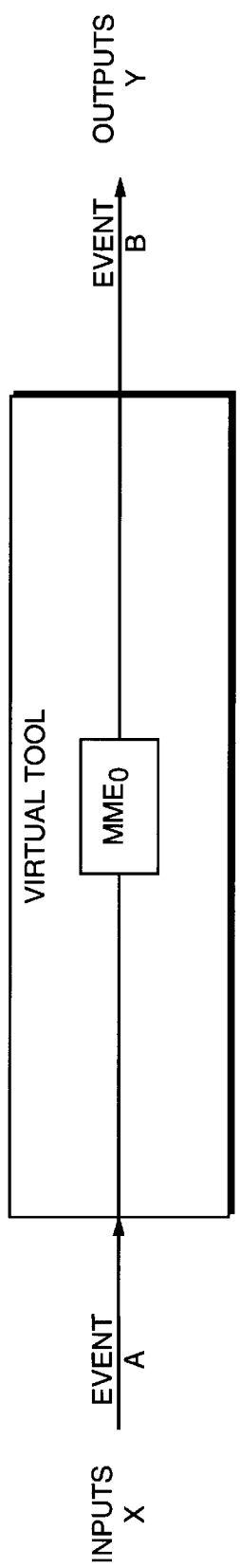
FIG. 11A is a block diagram illustrating a basic virtual tool consisting of a single man/machine emulation or MME.

Virtual tools can be created from a single MME, an arrangement of MME's, or a combination of MME's and traditional procedure software algorithms (FIGS. 11a, b, c). The virtual tool is created as a primary or higher level task within the process which is being emulated and as such can be arranged in arbitrary relationship to other virtual tools: series, parallel, iterated, hierarchical, etc.

Referring to FIG. 11a, Inputs X and Outputs Y refer to the data associated with the input and output, respectively, of the task that the virtual tool is emulating. In the case of FIG. 11a, the task can be represented by a single MME, Element $MME_0$. Event A may be any single or combination of actions or states that the invention has been told to recognize as Event A, such as specific user input, availability of data (Inputs or Outputs), the completion of some virtual tool, etc. Upon completion of $MME_0$, Event B will be generated by the Tool Manager to signify this fact and Outputs Y will be made available to whichever virtual tools are to follow.

Figure 11B:
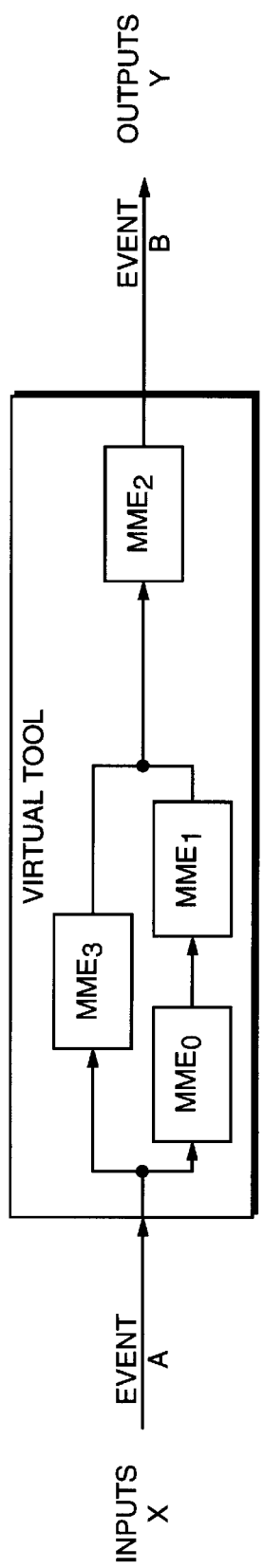
FIG. 11B is a block diagram illustrating a complex virtual tool of several MME's.

Referring now to FIG. 11b, the virtual tool responds to the same Inputs X and Event A as the virtual tool illustrated in FIG. 11a. This virtual tool, however, is composed of Elements $MME_0$, $MME_1$, $MME_2$, and $MME_3$, and therefore represents the decomposition of the corresponding actual task as the illustrated arrangement of four subtasks in a series-parallel combination, rather than the singular decomposition of FIG. 11a. This virtual tool creates Event B and Outputs Y upon its completion and is therefore functionally equivalent to not only the actual task which maps Inputs X to Outputs Y on Event A and produces Event B upon completion, but also to the Virtual Tool MME of FIG. 11a.

Figure 11C:
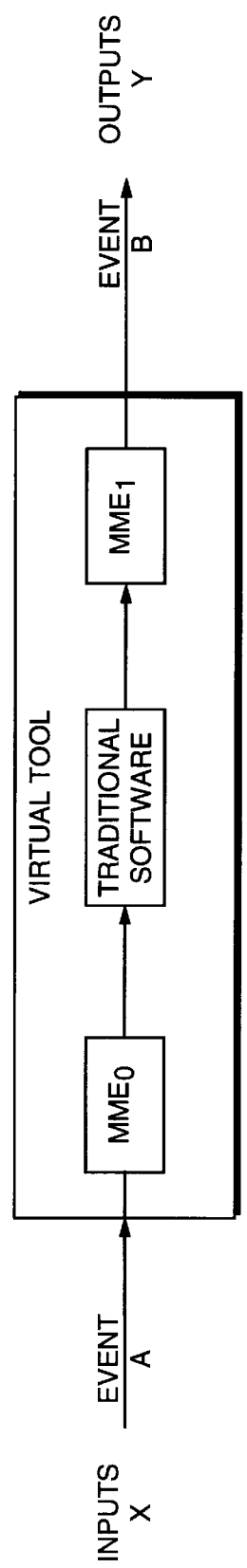
FIG. 11C is a block diagram illustrating a complex virtual tool of MME's and traditional software algorithms.

Referring now to FIG. 11c, the virtual tool is identical in every regard to that of FIGS. 11b and 11c, except that the task represented by this implementation of the virtual tool has been decomposed into a serial arrangement of $MME_0$, a traditionally coded software algorithm, and $MME_1$. Element Traditional software is representative of a process, algorithm, technique, or other application represented in a commonly available software language, such as C, C++, or VHDL.

Figure 12:
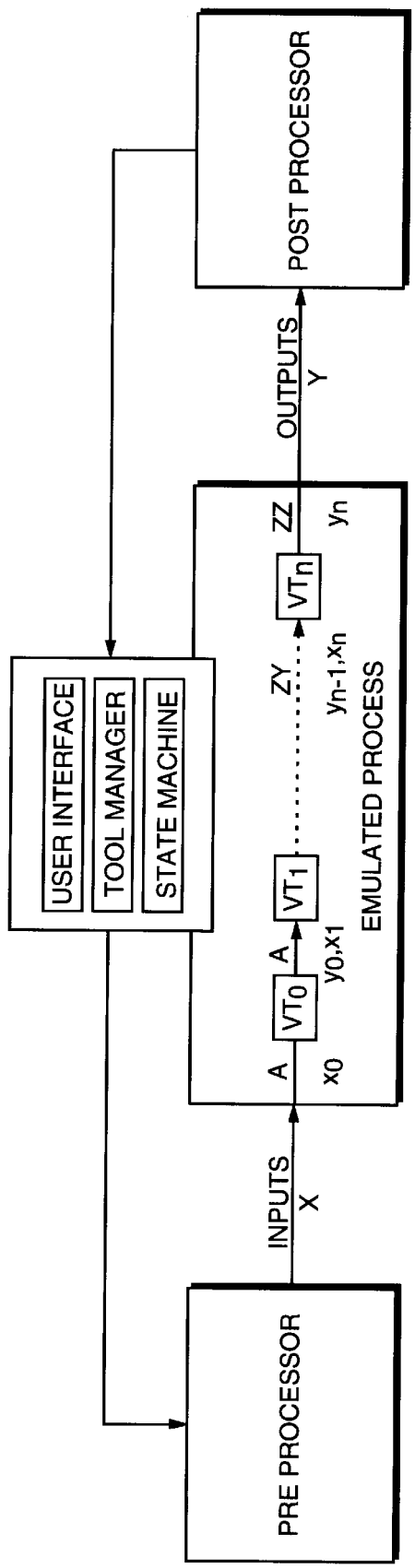
FIG. 12 is a block diagram of the invention in generic form.

To create an MME for a very complicated task or process, virtual tools can be arranged in a hierarchical, as well as series, parallel, or recursive, fashion. FIG. 12 shows a hierarchical virtual tool, Element Emulated Process, which is composed of N virtual tools, each with associated inputs (labeled $x_0, x_1 \ldots x_n$ in FIG. 12), outputs (labeled $y_0 \ldots y_{n-1}$, $y_n$ in FIG. 12), and events (labeled A, B . . . ZY, ZZ in FIG. 12). The Input X and Output Y are for the highest level virtual tool, Element Emulated Process. Assuming that the task represented by Element Emulated Process is identical to that illustrated in FIG. 11, Element Emulated Process would be identical in every regard to those in FIG. 11, with the exception that the task has been decomposed into a more complicated subset of virtual tools. Elements Pre-Processor and Post-Processor transform the data to and from the User Interface Element of the Tool Manager into Inputs X and Outputs Y, respectively.

Figure 6:
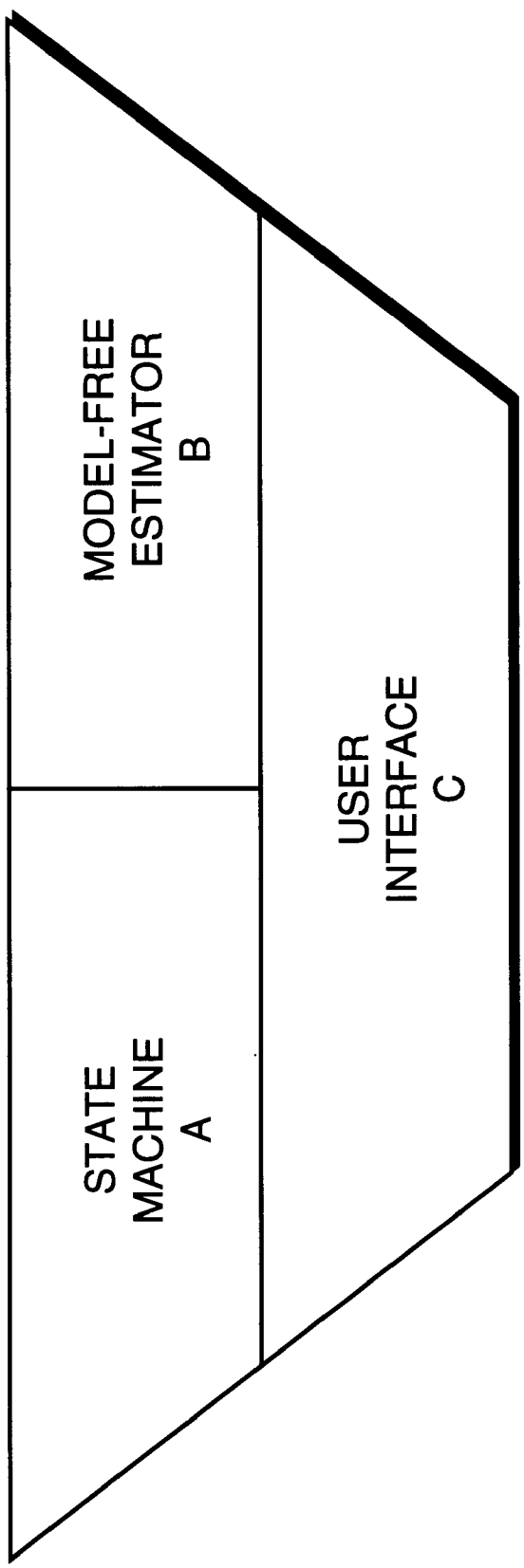
FIG. 6 is a block diagram illustrating the functional components of the Tool Manager Function, Element G of FIG. 2.

The operation of the virtual tools is supervised and sequenced by the state machine elements of the Tool Manager of FIG. 6, as shown in FIG. 12. The state machine component of the Tool Manager provides the inputs to the virtual tools, monitors its progress toward completion by way of the Events in FIG. 11, and manages the virtual tools' outputs. The user interface component of the Tool Manager provides interaction with the user during operational and training modes of the invention. Upon completion, the outputs are stored such that they can be accessed by virtual tools to be executed later in the process emulation. The state machine element of the tool manager is implemented, as a dynamically configurable and reloadable finite state machine (FSM), where the states are the virtual tools representing the tasks of the process and the events are steps linking the process tasks.

Figure 13A:
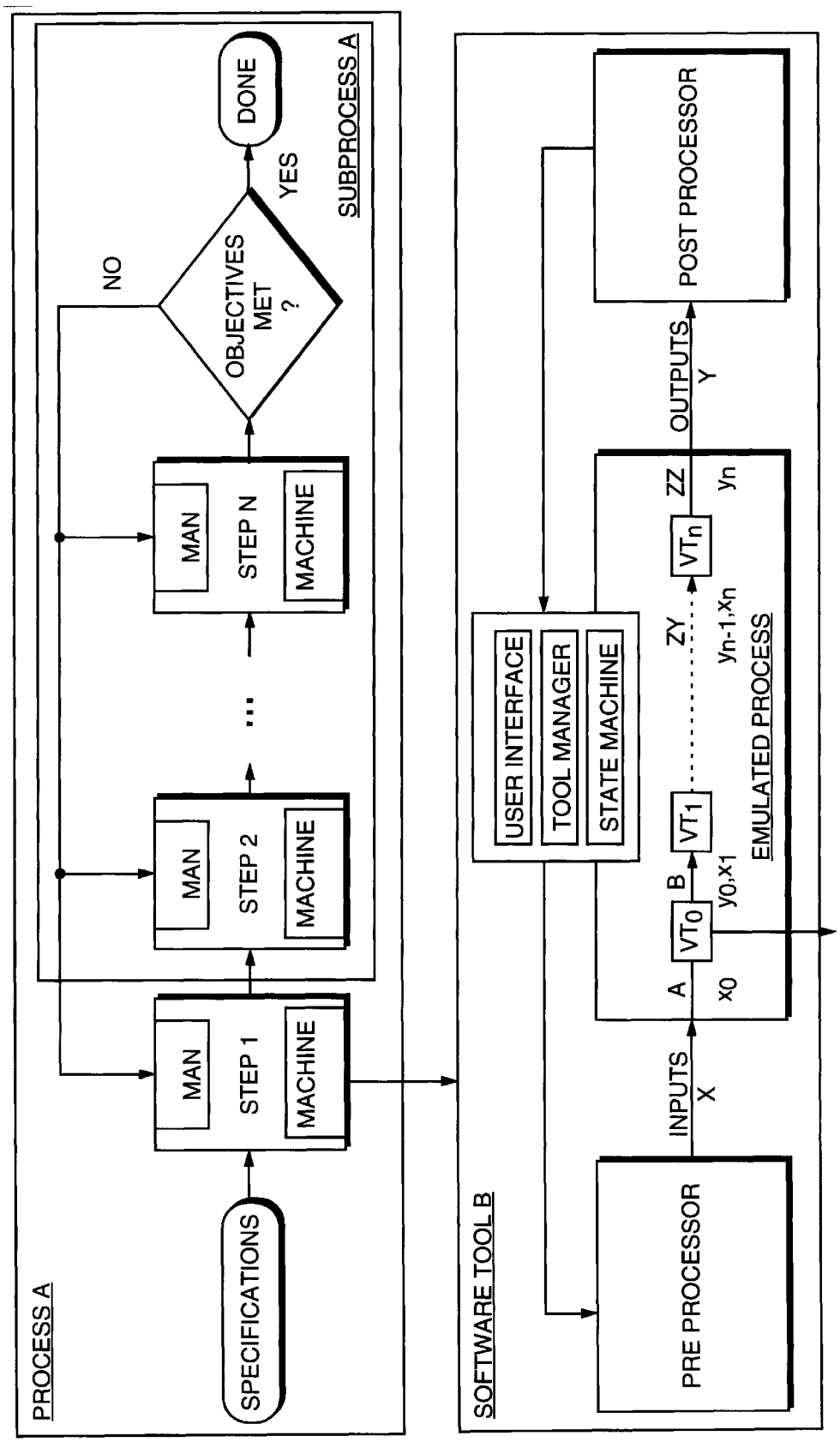
FIGS. 13A and 13B are is a block diagram illustrating an example of the methodology and architecture of the invention.
Figure 13B:
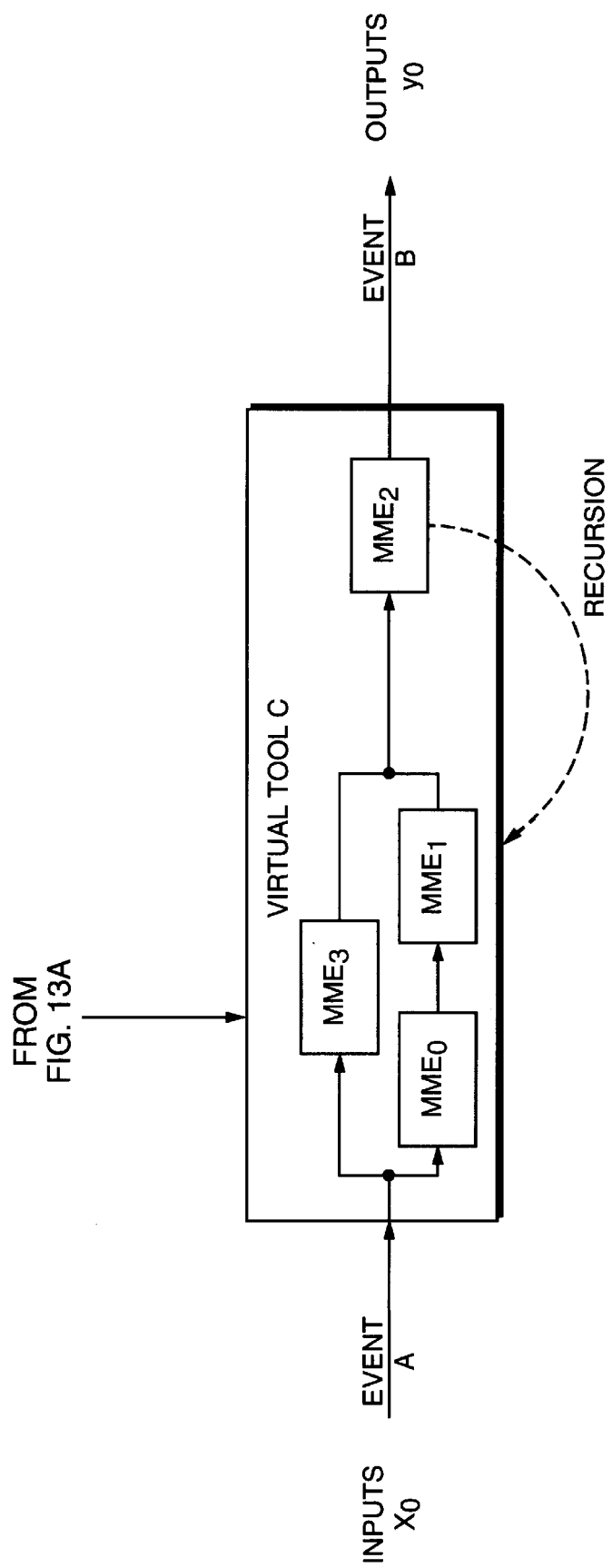

The combination of FSM and fuzzy neural net based MME creates a generic methodology and architecture for emulating a process in software (FIGS. 13A and 13B). Element Process A of FIG. 13A illustrates the entire process which is to be performed and for which specifications are known. FIGS. 13A and 13B are is derived from FIG. 9 in its entirety and its tasks have been subdivided into Element Subprocess A and Element Step 1. This illustration of the invention in its most general application shows that Subprocess A is embodied as Element Software Tool B and is made available to the Element man of Element Step 1 in the form of Element machine. Element Subprocess A is representative of one or any number of tasks which follow Element Step 1 and which may need to be iterated because the criteria for completion of the process, or identifiable tasks, collections of tasks, or subprocesses, are not met in the current iteration.

Still referring to FIGS. 13A and 13B, Element Software Tool B is derived in its entirety from FIG. 12. Element Emulated Process contained within Element Software Tool B is a virtal tool composed of other virtual tools and corresponds to the actual steps or tasks contained within Element Subprocess A.

Still referring to FIGS. 13A and 13B, Element Virtual Tool C is a representative reproduction of the virtual tools illustrated in FIG. 11. Furthermore, Element Virtual Tool C is representative of all the virtual tools comprising Element Emulated Process. Finally Virtual Tool C itself maybe itself defined by some composition of virtual tools, as illustrated in FIGS. 13A and 13B in which Element MME2 contained within Element Virtual Tool C is shown (by way of the dotted line labeled "recursion" in FIGS. 13A and 13B) to be itself defined by a virtual tool In the case of the initial application of the invention, the process is broken down into three virtual tools (placement, routing, and analysis) which are controlled by a FSM. These virtual tools can be further decomposed into lower level virtual tools representative of tasks at even finer granularity such that fuzzy neural net techniques can be used to derive the MME.

Referring back to FIG. 1, the flow chart of the conventional steps in the IC design process, the logical design phase of the process is shown in steps A & B. The physical properties of the design are determined during physical design realization as shown in steps C & D. The analysis phase is used to determine whether assumptions made in steps A & B are consistent with what was determined to be the physical design (i.e. what will be manufactured to within preselected manufacturing tolerances) in steps C & D.

Figure 2:
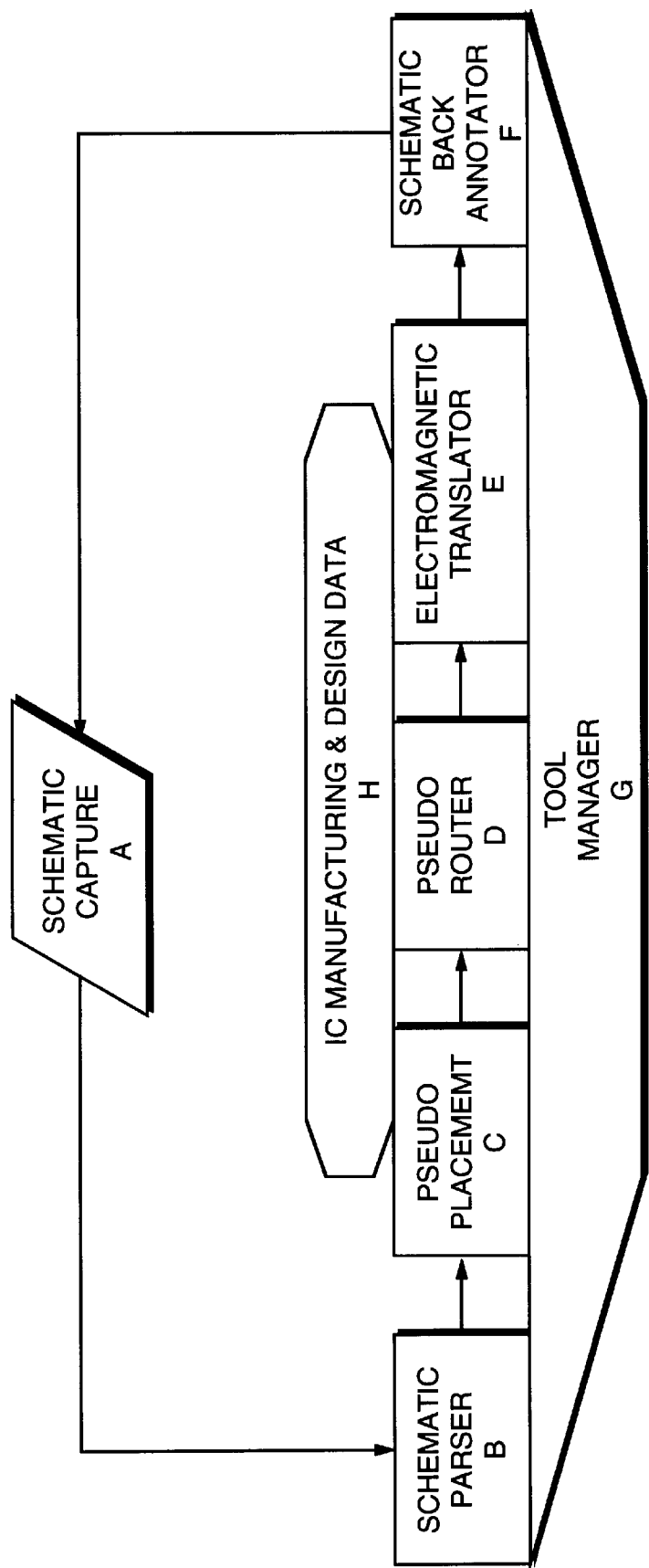
FIG. 2 is a block diagram and flow/control chart illustrating the sections of the initial application of the invention by function.

At the highest level, the initial application of the invention is described in FIG. 2 in terms of the ideal flow of data through the functional elements of the invention.

Figure 1:
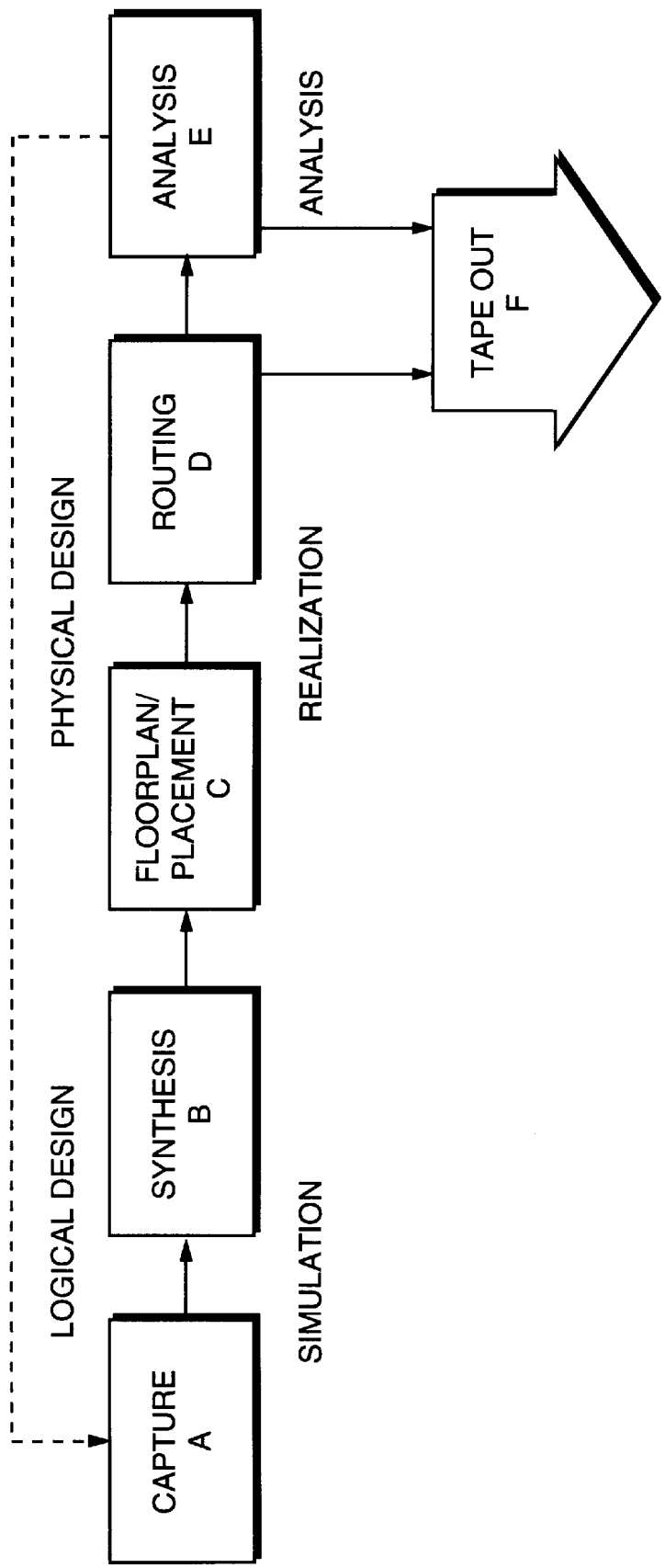
FIG. 1 is a flow diagram illustrating the steps in the conventional process of creating production designs for integrated circuits.

The legend or description of the elements of FIG. 2 follow:

a) Function A "Schematic Capture"—a pre-existing software tool supporting the functionality outlined in FIG. 1, Element A.

b) Function B "Schematic Parser"—a software component of the invention which translates data from Function A to a format defined for the use by the software components of Functions C through G.

c) Function C "Pseudo Placement"—a software component of the invention which performs the function of FIG. 1, Element C, based on data from FIG. 2, Functions B and H.

d) Function D "Pseudo Router"—a software component of the invention which performs the function of FIG. 1, Element D, based on data from FIG. 2, Functions B, C, and H.

e) Function E "Electromagnetic Translator"—a software component of the invention which performs the function of FIG. 1, Element E, based on data from FIG. 2, Functions B, C, D, and H.

f) Function F "Schematic Back-Annotator"—a software component of the invention which translates the data from FIG. 2, Function E to a format compatible with and useful to the user of FIG. 2, Function A.

g) Function G "Tool Manager" a software component of the invention which controls execution of and data communication between the other software components of the invention, Functions B through F.

h) Function H "IC Manufacturing & Design Data Information"—data representative of the IC manufacturing process to be used for the subject IC design and for other representative IC designs in that manufacturing process or functionality similar to the subject IC design.

Referring now to FIG. 2, Function A, "Schematic Capture", the design is entered into a commercially-available, Computer-Aided Engineering (CAE) system for the purpose of specifying the electrical schematic capture, either graphical ("schematic-based") or textual ("language-based"). Graphical capture is normally referred to as "Schematic Capture" and is commercially-available using tools from companies, like Cadence Design Systems, Mentor Graphics, and Viewlogic.

The schematic capture function identifies the components of the electrical design, called blocks or cells or blocks/cells, the properties or attributes of these blocks/cells, the pins on these blocks/cells which represent external connections to provide electrical input/output to the block/cell, and the electrical connections between or among pairs or groups of block/cell pins, called "nets".

Information specific to the user, such as manufacturing and design information, is needed for the operation of both the schematic capture software and the invention. This information is shown as Function H. Use of this data by the schematic capture function is specific to the commercially available method being used. Use of this data by the invention may or may not involve the use of the Schematic Parser Function, the format specific to the commercially available method, or some other standard or proprietary format. Data in this category will include, but may not be limited to:

a) IC process information regarding the mask layers in the process and their resulting material properties, statistical or nominal.

b) Schematic capture symbols for blocks/cells for graphical capture.

c) Language-based descriptions of blocks/cells for textual-based capture.

d) Electromagnetic analysis results from a designed experiment for the purpose of predetermining an interconnect model for routes given the manufacturing process as a function of channel width, channel density, and other parameters deemed important by the user.

e) Historical data as represented by designs (schematics, placements, routes, and analyses) which can be used to alter to enhance the neural nets imbedded in the invention.

Function G, the "Tool Manager" software component, coordinates the actions of each function, between each function, and among the various software and data components of the invention. Function G provides the primary interface to the user through graphical, textual, and other means as predetermined to be the most ergonomic (See FIG. 6, Element C, below).

The management of both the operational state and the training state of the invention is performed by Function G. The operational state controls the flow of the data and specific functionality of the software component throughout the use of a finite state machine (See FIG. 6, Element A, below). The training state alters existing fuzzy neural nets within the invention, or creates new neural nets for use by the invention.

Where the alteration of the neural nets does not involve the creation of new neural net inputs or outputs, the training can be done in a straight-forward manner using one of the conventional methods for neural net training, such as back-propagation. In all other cases, the algorithm to be used to create neural nets of unspecified input, output, and/or size is performed using model-free estimation or functional approximation.

Still referring to FIG. 2, Function B, the "Schematic Parser", is a software component of the invention which translates the data represented by the schematic from the schematic capture tool-specific format to one which is proprietary, consistent, and universally known to the software components comprising the invention. This data output of Function B is set aside for later use (by the various software components of the invention) and managed by Function G until such time as the user decides to update this data by re-running Function B. This function will also be used in the training mode.

Function C, the "Pseudo Placement Function", is a software component of the invention which performs the function of FIG. 1, Element C, based on data provided by FIG. 2, Function B, above. The output of Function C is the identification of routing channels and their size as well as an ensemble, or collection, of likely placements that would have otherwise been generated manually by the user with assistance of a floorplanning tool as in FIG. 1, Element C.

In training mode, Function C takes previous schematic and placement data from Function H, (see below) and incorporates the relationships between blocks/cells, pins, properties, nets, and their instantiation on schematics, floorplans/placements and routes into it's neural nets as a preferential method for placement.

Still referring to FIG. 2, Function D, the "Pseudo Router Function", is a software component of the invention which performs the function of FIG. 1, Element D, based on data provided by Functions B, C, and H. The output of Function D is the realization of nets as routes as identified by the channels through which the route would travel in going from pin to pin.

An ensemble, or collection, of likely routings is thus generated for each member of the Function C ensemble. Any one of these routes would have otherwise been generated manually by the user with assistance of a routing tool as in FIG. 1, Element D. The ensemble of routes from the ensemble of placements is then evaluated statistically to give a better estimate of the time delay associated with a given interconnect than would have otherwise been obtained by a single routing of the design.

In the training mode, Function D takes previous schematic, placement, routing, and electromagnetic analysis data from Function H and incorporates the relationships between blocks/cells, pins, properties, nets, and their instantiation on schematics and floorplans/placements and routes into Function D's neural nets as a preferential method for routing.

Still referring to FIG. 2, the evaluation of interconnect time delay from interconnect route is performed by Function E, the "Electromagnetic Calculator Function". For any given route, Function E looks at the channels through which the route traverses and for each channel evaluates a representative time delay for that route given the properties of the channel and any pertinent attributes of the route, like type of route (e.g. bus, clock, etc.) and/or its criticality. The time delay is then the sum of the contribution from each channel.

Under training mode, the electromagnetic analysis results from Function H are used to train the Function E neural net to reproduce, interpolate, and infer, as required, the time delay from the properties of the channel.

The medium for capturing the electrical connectivity, FIG. 2, Function A, is then updated with the time delay results for the desired nets through Function F, the "Schematic Back Annotator Function". Function F takes the raw values for the time delay for each net, translates it into the appropriate format, and inserts it into the appropriate location within the data representing the schematic as used by Function A. This functionality is highly dependent on the method of capturing the schematic data and will vary and must be implemented for each software tool which could perform the role of Function A.

Information on the actual implementation of the functional sections of FIG. 2 follows.

The Schematic Parser Function, is simply an interface as defined by a commercially available tool used for Schematic Capture and a parser. The interface can take the form of some customization language, like AMPLE™ for Mentor Graphics' Design Architect schematic capture or SKIL™ for Cadence's Compose schematic capture, or a standard data format, like EDIF (Electronic Design Interchange Format) The parser section of Function B will take this raw input and translate it into a data format representing the internal standard by which the invention keeps its internal data. This is a simple matter of building one data structure from another.

One component of the data structure which Function B will create is the connectivity matrix, "C". This matrix represents the percentage of a block's/cell's pins on nets which are connected to another. Thus $C_{ij}$ is the percentage of cell i's pins connected to cell j's pins.

Still referring to FIG. 2, the Function F "Schematic Back Annotator Function" is the inverse of the Schematic Parser Function. It takes the data format internal to the invention and transforms it into one which is accepted by the commercially available schematic capture tool of Function A. Then, using the API of the tool, the data is appended to or modifies that already in the schematic.

Figure 3:
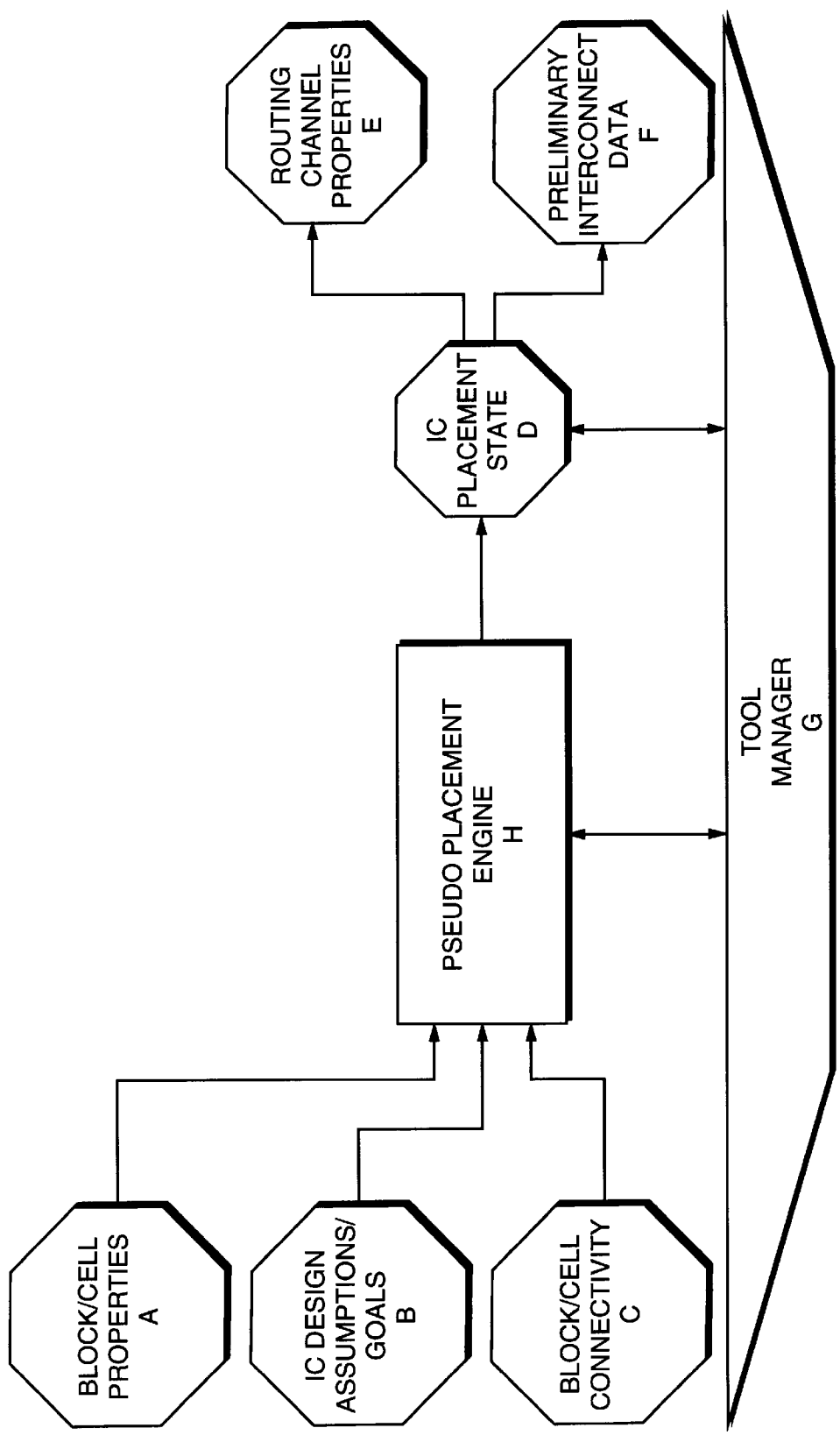
FIG. 3 is a flow chart illustrating the elements and data flow of the Pseudo Placement Function, Element C of FIG. 2.

The FIG. 2, Function C "Pseudo Placement Function", is a combination of data and software components illustrated in FIG. 3. The legend or description of the elements of FIG. 3 follows:

a) Element A "block/cell properties"—data output from FIG. 2, Function B.
b) Element B "IC design assumptions/goals"—data output from FIG. 2, Function B.
c) Element C "block/cell connectivity"—data output from FIG. 2, Function B.
d) Element D "IC Placement State" object—a data component of the invention which maintains a representation of the current state of the placement IC as to where blocks/cells are located and the ability to manipulate and/or query this representation. The data components of this representation include block/cell locations, routing channel locations, and preliminary interconnect (routing) data.
e) Element E "routing channel properties"—a data component of Element D, FIG. 3 which represents the location and size of routing channels.
f) Element F "preliminary interconnect data"—a data component of Element D, FIG. 3 which represents the initial conditions or estimates of the path and length of routed interconnects.
g) Element G "Tool Manager"—a software component of the invention that controls execution of and data communication between the other software components of the invention (FIG. 2, Functions B through F).
h) Element H "Pseudo Placement Engine"—a software component of the invention which is a pre-determined, idealized method of block/cell placement.

Referring now also to FIG. 3, Pseudo Placement Function, the central functionality of this part of the invention resides in Element H. Inputs to this element are block/cell connectivity from Element C, and properties from Element A as derived from FIG. 2, Function A, via the Schematic Parser Function of FIG. 2, Function B, and as derived from FIG. 2, Function H, and from IC design assumptions and goals as specified by the user via the FIG. 2, Function G, Tool Manager or Function B, Schematic Parser. The output of the FIG. 3, Pseudo Placement Function, is the placement of a given block/cell on the IC.

Figure 7:
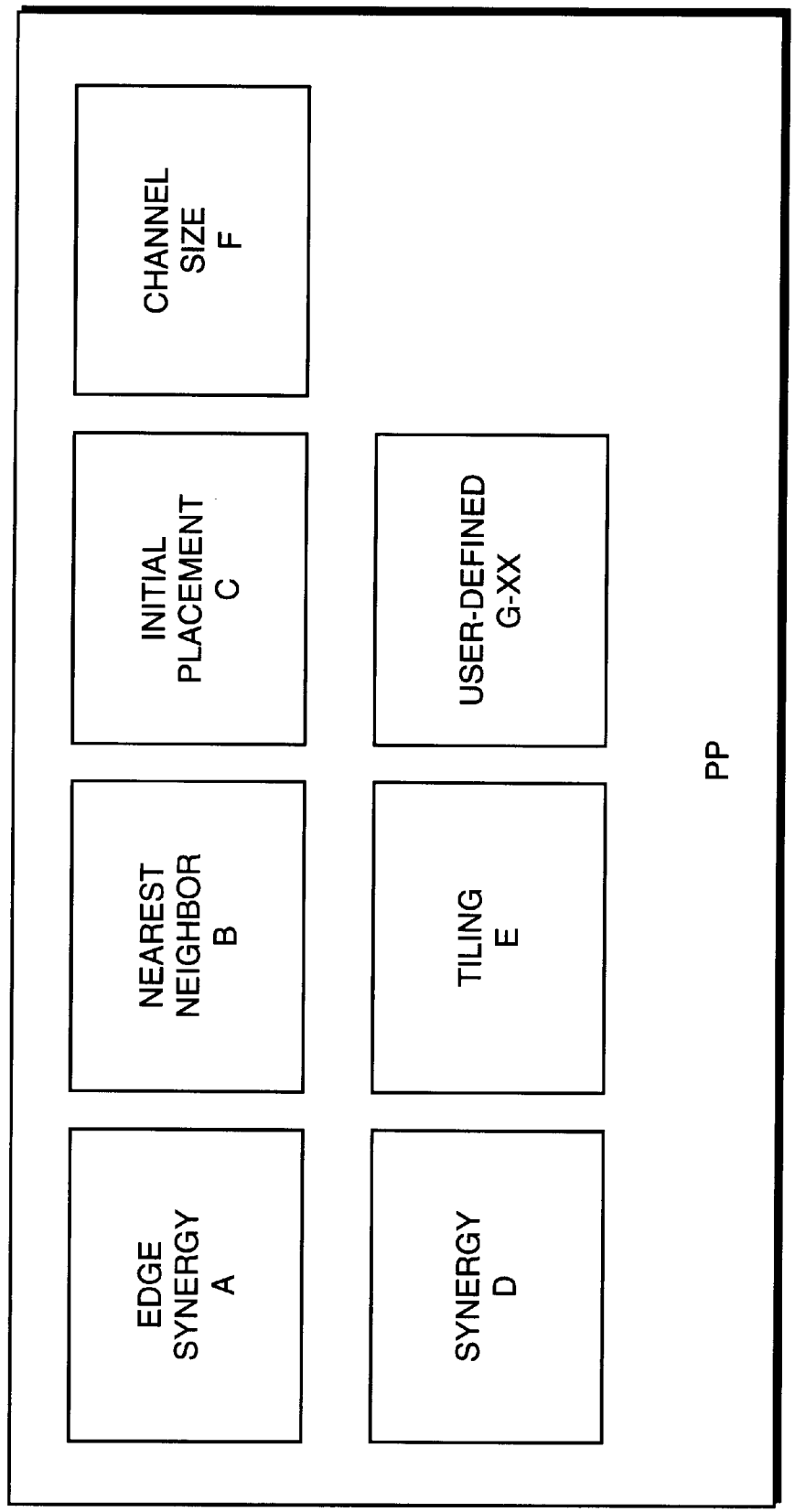
FIG. 7 is a block diagram illustrating the neural net components of the Pseudo Placement Function of FIG. 3.

The FIG. 3, Pseudo Placement Function, is comprised of several predetermined, programmable, and user-definable neural nets as shown in FIG. 7, "Pseudo Placement Function-Internal View". The legend or description of elements of FIG. 7 follows:

a) Element A "Edge Synergy"—predetermined neural net component of the invention which determines relative placement of a block/cell to the edge of an IC.
b) Element B "Nearest Neighbor"—predetermined neural net component of the invention which grossly determines relative placement of a block/cell with regard to a given block/cell.
c) Element C "Initial Placement"—predetermined neural net component of the invention which determines the relative placement of a block/cell with regard to a given block/cell more precisely than FIG. 7, Element B.
d) Element D "Synergy"—programmable neural net component of the invention which determines the degree to which a given block/cell should be placed near a second block/cell.
e) Element E "Tiling"—predetermined neural net component of the invention which finely positions a given block/cell with regard to the current state of IC.
f) Element F "Channel Size"—programmable neural net component of the invention which estimates the size of the routing channel based on the current state of the IC.

g) Elements G through XX "User-Defined"—undetermined neural net component(s) which the user of the invention will define and train, and specify for use by the Pseudo Placement function under control of the Tool Manager.

Referring now also to FIG. 7, the neural nets of FIG. 7 are of two types, Computational, (C), and Procedural, (P), as enumerated in Table 1, below.

data for other neural nets or by the Tool Manager. Computational nets are typically not called iteratively with regard to a single problem under consideration by the Tool Manager. Procedural neural nets ("P" in the above table) are run iteratively and provide expert guidance in the completion of a task by defining events for the state machine.

The inputs to the neural nets of FIG. 7 are fuzzy sets as defined in the following Table 2. Fuzzy set values described

TABLE 1

| Neural Net | Inputs | Outputs | Function |
| --- | --- | --- | --- |
| Edge Synergy (C) | thermal dissipation<br>edge connectivity | relative position with respect to IC edge | Gross sort of cells according to proximity to edge |
| Synergy (C) | connectivity<br>instance history<br>schematic proximity | synergy | Relative idealized proximity of one cell given another |
| Nearest Neighbor (C) | synergy<br>test cell dominant edge<br>seed cell dominant edge | relative position with respect to a given cell | Gross sort of cells according to proximity to a given cell |
| Initial Placement (P) | synergy<br>place cell dominant edge<br>seed cell dominant edge<br>angle adjustment<br>radius adjustment | polar coordinates relative to seed for place location | Identify position of place cell given a seed cell |
| Tiling (P) | origin of place cell<br>dimension of place cell<br>degree of overlap with other cell(s)<br>location of overlap with other cells(s) | direction and magnitude for movement of place | resolve overlaps of cells and provide fine placement |
| Channel Size (C) | current size of channel<br>pin count of place cell<br>place cell to channel proximity<br>number of routing layers | width of channel | estimate size of channel required prior to routing |
| User-Defined (C,P) | defined by user | defined by user | defined by user |

Computational nets (an annotated "C" after the neural net name in the table) compute a value which is then used as as "NOT APPLICABLE" imply that these items are treated as numeric values and are not mapped into a fuzzy set.

TABLE 2

| Input/Output | Description | Fuzzy Set Values | Source (if Input) |
| --- | --- | --- | --- |
| thermal dissipation | heat generated by a cell | hi, med, low | schematic |
| edge connectivity | % of a cells pins connected to a pad | hi, med, low, very low | connectivity matrix |
| connectivity | % of a place cell's pins connected to a seed. | very high, high, mod, low, very low | connectivity matrix |
| instance history | historically-based proximity between two cells | high, med, low, and no correlation | user-programmable neural net |
| schematic proximity | relative position of two cells from the schematic | nearest neighbor, second nearest neighbor, same sheet, in vicinity, no relation | SP |
| Synergy | see FIG. 7, element D | very high, high, med, low, none | synergy neural net |
| place cell dominant edge | given a place and seed, the weighted average location of the pins | right center, right top, top middle, left top, left center, left bottom, bottom middle, right bottom | SP |
| seed cell dominant edge | given a seed and place, the weighted average location of the pins | right center, right top, top middle, left top, left center, left bottom, bottom middle, right bottom | SP |
| angle adjustment | degree to which polar angle should be changed to get a good placement | very negative, negative, none, positive, very positive | IC placement state |

TABLE 2-continued

| Input/Output | Description | Fuzzy Set Values | Source (if Input) |
|---|---|---|---|
| radius adjustment | degree to which polar radius should be changed to get a good placement | very negative, negative, none, positive, very positive | IC placement state |
| origin of place cell | x,y position place cell origin | NOT APPLICABLE | IC placement state |
| dimension of place cell | x,y length of place | NOT APPLICABLE | SP |
| degree of overlap | % that place overlaps with cells already placed | NOT APPLICABLE | IC placement state |
| location of overlap | position of overlap with place and existing cells | right top, left top, left bottom, right bottom | IC placement state |
| current size of channel | width of channel | NOT APPLICABLE | IC placement state |
| pin count of place | number pins on place | NOT APPLICABLE | SP |
| place cell to channel proximity | relative distance between channel and place | adjacent, near, far, none | IC placement state |
| number of routing layers | layers available for routing | NOT APPLICABLE | IC manufacturing data |

TABLE 3

| Output | Neural Net | Description | Fuzzy Set Values |
|---|---|---|---|
| gross sort of cells | Edge Synergy | relative position to edge | corner, edge, 2nd ring, 3rd ring, 4th ring, inside |
| Synergy | Synergy | see "Synergy" description in Table 1 | very high, high, med, low, none |
| relative position | Nearest Neighbor | see "Nearest Neighbor" description in Table 1 | nearest, 1st, 2nd, not a (nearest neighbor) |
| polar coordinates | Initial Placement | radius and angle (with respect to seed cell position) | radius - units of minimum block size angle - same as place cell dominant edge |
| resolve overlaps | Tiling | direction to move place magnitude to move place | same as angle, above same as radius, above |
| width of channel | Channel Size | relative width of channel | very wide, wide, moderate, narrow, none |

Describing the operation of the invention generally; under the control of the finite state machine of the Tool Manager, the operation of the Pseudo Placement Function executes in the following manner in the absence of user-defined neural nets. The edge connectivity is determined for each block/cell. The edge synergy net then sorts the blocks/cells into descending order with regard to their placement proximity to the chip edge. A cell with a high degree of edge synergy is then chosen as a "seed" cell to start the placement.

The nearest neighbor and synergy neural nets are then used to sort the remaining block/cells into descending order with regard to their priority for being placed near the seed cell. A "place" cell is selected from this sorted list. The initial placement neural net (IPNN) then determines an appropriate region relative to the seed for the place. The IC placement state (object ICPS) is then queried to see if the position recommended by the IPNN is available. If it is not, then the IPNN is re-run with updated information from the ICPS until a placement is made. The tiling neural net then provides directions iteratively for moving the place cell into position.

This process is repeated for each place cell (those with connectivity>0% to the seed cell or some other positive percentage less than 100% as selected during training mode to optimize the PP engine performance). Once all place cells for that seed are placed, a new seed cell is selected from the remaining unplaced cells and the process repeats for place cell placement. Thus a single placement is done in this manner. The ensemble of placements is built by repeating this several times under the control of the Tool Manager depending on tradeoffs between accuracy and speed as specified by the user.

The output of the Pseudo Placement Function is fed to the IC placement state object, FIG. 3, Element D, which keeps track of the placement of blocks/cells and which areas of the chip are unplaced. The IC placement state object is a data structure and set of services. The data for the IC placement state is a matrix representation of the blocks/cells and channels, and where they are physically located on the IC. A set of services are supported by the IC placement state object allowing for the placement and movement of cells, reporting of their location, the degree to which a specified region of the IC is occupied or free, and other functionality as defined in Table 1 through Table 3.

Outputs of the IC placement state object are the properties of the routing channels and preliminary interconnect data, as well as providing a set of services to the Pseudo Placement Function. Routing channel properties are the size and location of channels. Preliminary interconnect data are a global estimate of total interconnect length and routes between adjacent cells in the placement.

FIG. 6 depicts the elements of the Tool Manager. The legend or description of the elements of FIG. 6 follows:
  a) Element A "State Machine"—a software component of the invention, a finite state machine which controls the interaction of all other software components and the flow of data into and out of those components.
  b) Element B "Model-Free Estimator"—A neural-net based system which assists the user of the invention in the training of the invention by generating models to be used by the states of FIG. 6, Element A, during execution of the invention.
  c) Element C "User Interface"—a portion of the Tool Manager through which the user of the invention directly interacts.

Referring now also to FIG. 6, the "State Machine", Element A of FIG. 6, controls the sequence of operations and the movement of data within the Pseudo Placement Function during operational mode. The FIG. 6, Element B "Model Free Estimator" of the Tool Manager, along with the Element A "State Machine", controls the sequence of operations and the movement of data within the Pseudo Placement Function during the training mode. Any reporting of information or required input during and specific to the Pseudo Placement Function's training or operational mode is handled by the FIG. 6 Tool Manager's Element C, "User Interface".

Figure 4:
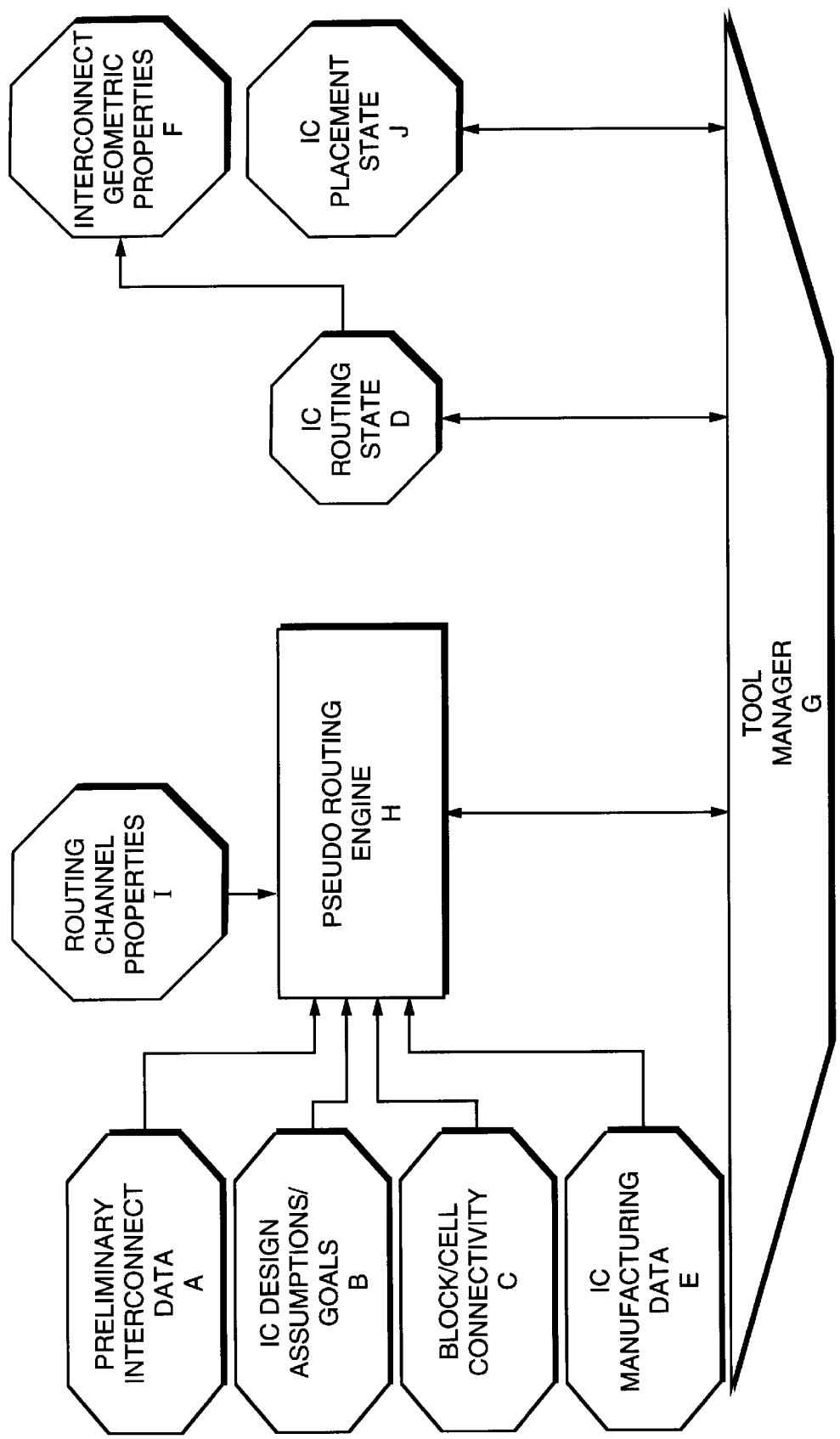
FIG. 4 is a flow chart illustrating the elements and data flow of the Pseudo Route Function, Element D of FIG. 2.

Referring now to FIG. 4, this diagram depicts the combination of data and software elements or components which, combined, form the Pseudo Route Function of FIG. 2. The legend, or description of the elements of FIG. 4 follows:

- a) Element A "preliminary interconnect data"—see FIG. 3, Element F.
- b) Element B "IC design assumptions/goals"—data output from FIG. 2, Function B.
- c) Element C "block/cell connectivity" data output from FIG. 2, Function B.
- d) Element D "IC Routing State" object—a data component of the invention which maintains a representation of the current state of the routed IC as to the channels, the routes within them, and the ability to manipulate and/or query this representation
- e) Element E "IC manufacturing data"—information from FIG. 2, Function H; specifically, the number of routing layers and their width and thickness.
- f) Element F "interconnect geometric properties"—the output of the Pseudo Route Function of the invention, comprising the route for each trace given the current state of the IC design as represented by the channel(s) through which each route traverses.
- g) Element G "Tool Manager" a software component of the invention which controls execution of and data communication between the other software components of the invention (refer to FIG. 2, Functions B through F).
- h) Element H "Pseudo Routing Engine" a software component of the invention which is a pre-determined, idealized method of block/cell routing.

The central functionality of the FIG. 4 Pseudo Route Function is Element H, the Pseudo Routing Engine. Inputs to Element H are FIG. 4, Element C, block/cell connectivity, as derived from Function A of FIG. 2 via Function B, the Schematic Parser, and as derived from Function H of FIG. 2, and IC design assumptions and goals as specified by the user via the Tool Manager or the Function B, Schematic Parser, and preliminary interconnect and routing channel properties as outputs of FIG. 2's Pseudo Placement Function. The output of the FIG. 4, Pseudo Route Function, is the channels through which a route travels for a given net.

Figure 8:
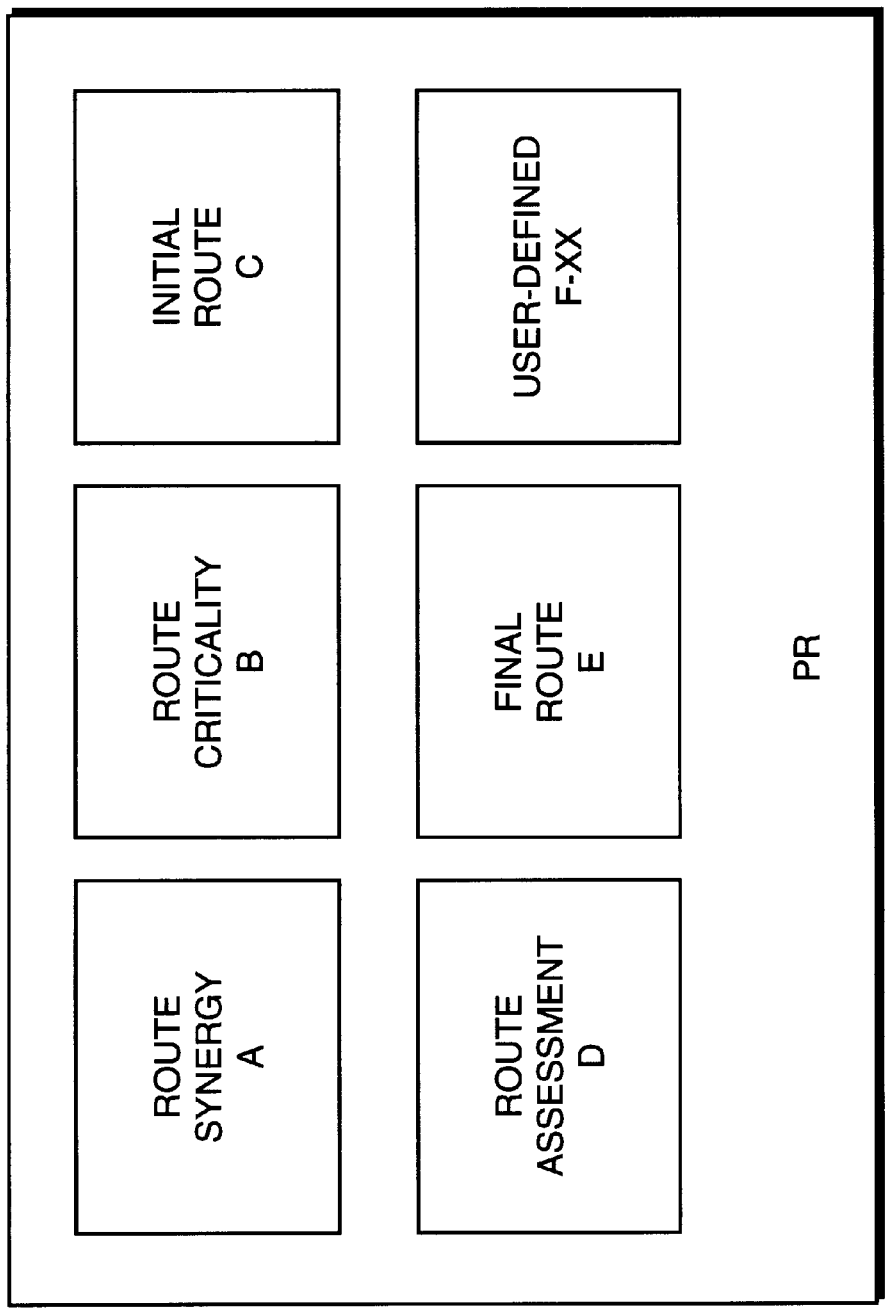
FIG. 8 is a block diagram illustrating the neural net components of the Pseudo Route Function of FIG. 4.

The FIG. 4 Pseudo Route Function is comprised of several predetermined, programmable, and user-definable neural nets as shown in FIG. 8. The legend or description of the elements of FIG. 8 follow:

- a) Element A "Route Synergy"—a predetermined neural net component of the invention which determines relative length of route based on the two block/cells defining the route endpoints.
- b) Element B "Route Criticality"—a programmable neural net component of the invention which determines relative priority of a given net.
- c) Element C "Initial Route"—a predetermined neural net component of the invention which grossly routes a given net.
- d) Element D "Route Assessment"—a programmable neural net component of the invention which assesses the quality of the routing performed by FIG. 8, Element C.
- e) Element E "Final Route"—a programmable neural net component of the invention which re-routes or adjusts routes based on FIG. 8, Element D.
- f) Elements F through XX "User-Defined"—undetermined neural net component(s) which the user of the invention will define and train, and specify for use by the Pseudo Route function under the control of the Tool Manager.

Referring to FIG. 4, there are again neural nets of two types, Computational, (C), and Procedural, (P), as enumerated in Table 4, below.

TABLE 4

| Neural Net | Inputs | Outputs | Function |
| --- | --- | --- | --- |
| Route Synergy (C) | synergy of blocks/cells route criticality type of net | relative importance of route | Gross sort of nets in descending order of routing importance |
| Route Criticality (C) | type of route instance history type of net | route criticality | Degree to which route should be made as short as possible |
| Initial Route (C) | route synergy route criticality locations of pins on net | idealized route | qualify route characteristics independent of other routes |
| Route Assessment (P) | preferred route length normalized channels traversed route criticality route synergy | route assessment | qualify differences between preferred route and routes of similar characteristics |
| Final Route (P) | channel density route criticality route assessment route type net type | final route | qualify characteristics of final route |
| User-Defined (C,P) | defined by user | defined by user | defined by user | i) Element I "routing channel properties"—see Element E, FIG. 3.
j) Element J "IC Placement State" object—see Element D, FIG. 3.

The inputs to the neural nets of FIG. 4 are fuzzy sets as defined in the following Table 5.

TABLE 5

| Input/Output | Description | Fuzzy Set Values | Source (if Input) |
| --- | --- | --- | --- |
| route synergy | relative importance of route(s) | very high, high, med, low, none | route synergy neural net |
| Synergy | see FIG. 7, element D | very high, high, med, low, none | synergy neural net |
| route criticality | degree to which route should be optimized toward routing optimization goal | very high, high, med, low, none | route criticality neural net |
| type of net | classification of nets | clock, bus, signal, power, other | SP |
| instance history | historically-based placement proximity between two cells | high, med, low, and no correlation | user-programmable neural net |
| type of route | classification of routes | power, signal, rip | SP |
| locations of pins on net | relative coordinates for pins defining net | NOT APPLICABLE | SP |
| initial route | quality of intial route with regard to nets with similar properties | very long, long, nominal, short, very short | initial route neural net |
| route assessment | quality of preferred route with regard to nets with similar properties | very long, long, nominal, short, very short | route assessment neural net |
| preferred route length | degree to which polar angle of place cell position should be changed to get a good placement | very long, long, nominal, short, very short | IC route state |
| normalized channels traversed | number of channels traversed by the preferred/final route normalized to the cells/blocks intersected by the Manhattan Box | NOT APPLICABLE | IC route state |
| channel density | % of channel already routed vs. channel capacity | NOT APPLICABLE | IC route state |

Under the control of the finite state machine of the Tool Manager, the operation of the Pseudo Route Function executes in the following manner in the absence of user-defined neural nets. (It should be remembered that local routes—those between the pins of blocks/cells on opposite sides of a single channel—are "routed" by the Pseudo Placement Function when the initial placement information is determined.) The route criticality and route synergy are determined. The former is a measure of the emphasis on making the route short in the context of other routes and other goals, such as overall IC size. The latter provides a gross sorting of the order in which the nets should be realized as routes if the user has specified that more than one net should be routed.

An initial estimate of the route ("idealized route") is obtained from the initial route neural net using a lower bound for the route length as generated by the Tool Manager. This lower bound is the minimum "Manhattan Route" (one which is on a fixed grid). The Tool Manager then compares this idealized route to the location of routable channels and realizes a true route by moving the idealized route to a contiguous series of channels based on the channel location data created by the Pseudo Placement Function.

The algorithm for creating this "preferred route" from the idealized route moves portions of the idealized route which overlap nonchannel areas to the nearest real channel within the rectangle defined by the pins at each end of the net (i.e. the endpoints of the idealized route). This preferred route is then assessed against the route and net properties to see the degree to which it can be further adjusted from a preferred route to a "final route" by using the route assessment neural net.

The Tool Manager creates a final route by using the route assessment neural net output to determine the degree to which the route should be moved to/from a channel given the channel's properties and the overall design optimization goals. The Tool Manager makes the appropriate moves and reports the final route to the IC route state object.

The output of the Pseudo Route Function is fed to the IC route object, FIG. 4 Element D, which keeps track of which routes have been routed and the channel through which any given route travels. The IC route state is a data structure and set of services. The data for the IC route state object is a matrix representation of the routes and channels, and where they are physically located on the IC.

A set of services are supported by the IC route state object allowing for the occupation and movement of route to/from a given channel, reporting of the route or channel properties, and other functionality as defined in Table 1 through Table 3. Output of the IC route state are the geometric properties of the routing channels. Routing channel properties are the size and density of the channels.

Figure 5:
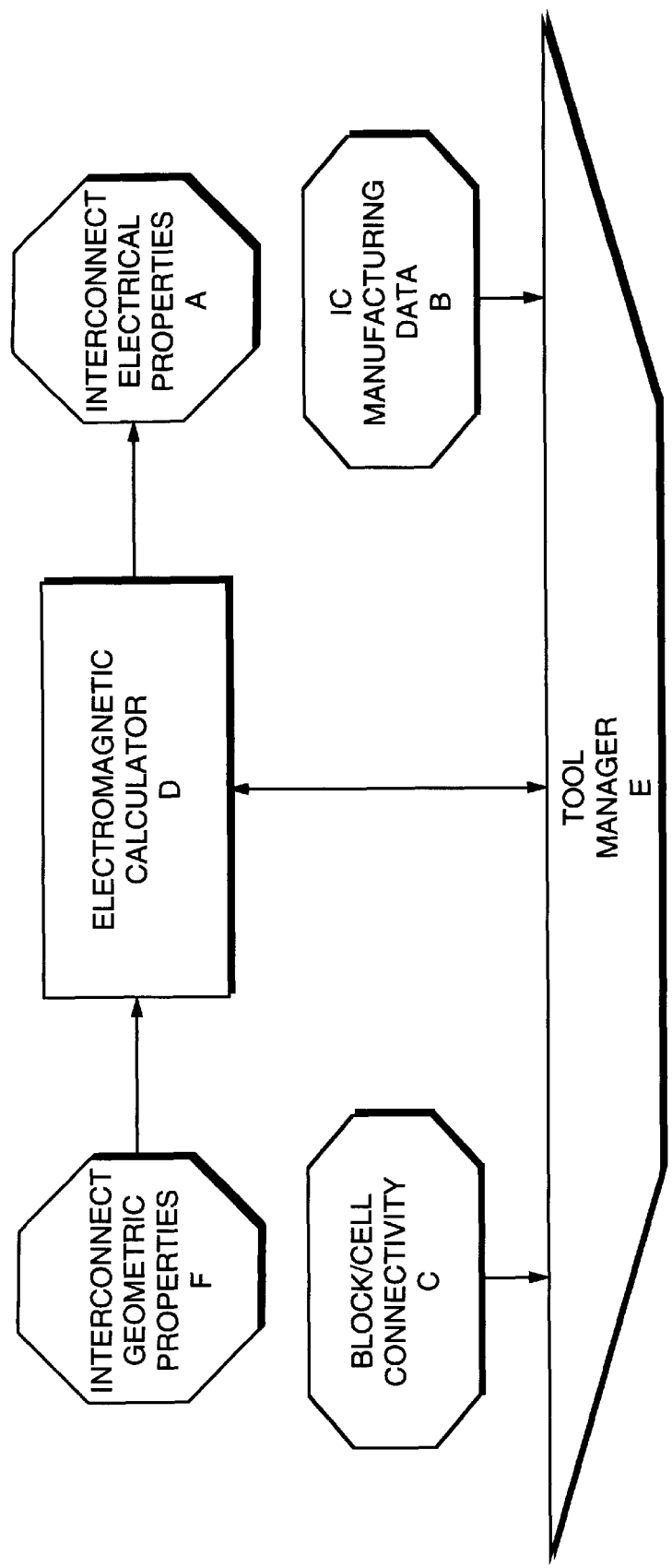
FIG. 5 is a flow chart illustrating the elements and data flow of the Electromagnetic Calculator Function, Element E of FIG. 2.

The Electromagnetic Translator Function of FIG. 2 is a combination of data and software components which combine as shown in FIG. 5. The legend or description of the elements of FIG. 5 follow:

a) Element A "interconnect electrical properties"—the data output of FIG. 5, Element D, representing the electrical properties of the interconnect(s) as requested by the user of the invention.

b) Element B "IC manufacturing data"—information from FIG. 2, Function H; specifically, the number of routing layers and their material properties. This information is used to adapt and build the predetermination aspects of FIG. 5, Element D, to the specific IC manufacturing process being used.

c) Element C "block/cell connectivity"—the data output from FIG. 2, Function B.

d) Element D "Electromagnetic Calculator"—software component of invention is a predetermined, adaptive, idealized method of converting geometric interconnect data to electrical interconnect data composed of a programmable neural net.

e) Element E "Tool Manager"—software component of invention controls execution of and data communication between the other software components of the invention (FIG. 2, Functions B through F).

f) Element F "geometric interconnect properties"—identical to FIG. 4, Element F.

The central functionality of the FIG. 2, Electromagnetic Translator Function is the FIG. 5, Element D, Electromagnetic Calculator. Input to the Electromagnetic Calculator during operational mode is the interconnect geometric properties, FIG. 4, Element F, which is the output from the Pseudo Route Engine, FIG. 4, Element F. The block/cell connectivity, FIG. 5, Element C, as derived from Function A of FIG. 2 via the Function B Schematic Parser, and as derived from Function H of FIG. 2, is used to identify nets and pins with respect to a given route or set of routes. IC manufacturing data, FIG. 5, Element B, is used during training mode to identify the process characteristics of the routing channel, such as the number of metal layers and their material properties. The output of the Electromagnetic Calculator is the electrical property of a route or route segment.

Under the control of the finite state machine of the Tool Manager, the operation of the Electromagnetic Calculator functions in the following manner. The neural net corresponding to the particular manufacturing data, FIG. 5, element B, is loaded into the Electromagnetic Calculator. The route to be analyzed is specified by the Tool Manager through the User Interface. The pins and or nets identified are converted to a route using the Tool Manager and the block/cell connectivity.

The geometric properties of the route and the channels through which it travels are retrieved from the interconnect geometric properties and are feed by the Tool Manager into the Electromagnetic Calculator, channel by channel, and are converted into interconnect electrical properties, such as time delay and crosstalk.

The Tool Manager accumulates the electrical results for a given route for each channel through which it travels. The Tool Manager then passes the final, accumulated electrical properties for a given route to either the Schematic Back Annotator or directly to the user via the User Interface.

The Electromagnetic Calculator, FIG. 5, element D, is a user-programmable neural net which takes as inputs properties of the routing channel (channel density, channel) and a value corresponding to the relative position of the route in question within the channel. The output of the Electromagnetic Calculator is the time delay and/or crosstalk of a route through a channel with those properties and for a route in the specified relative position within that channel. Various neural nets will be available corresponding to a variety of manufacturing processes as specified by the number of metal layers and their properties. During training mode, the metal layer and property information, FIG. 5, element B, is fed into the Electromagnetic Calculator as training data.

As will be realized, the invention is capable of other and different embodiments, and its several details are capable of modifications in various obvious respects, all without departing from the invention. The application of the invention as illustrated in FIGS. 1 through 8 emulates the IC design process for the purpose of simulating, emulating, analyzing, optimizing, or predicting interconnect delay data during the capture phase of the IC design process. By substituting sets of data used to train the fuzzy neural nets within the specified virtual tools, and in other cases, by substituting the virtual tools themselves, or by re-configuring the execution sequence of the virtual tools, several variations of the invention are enabled without departing from the invention. Some of these alternate applications of the invention are presented in the following paragraphs.

The fuzzy neural nets contained within the virtual tools are created through a user interface (UI) provided as part of the invention. The UI may or not be graphical. The UI allows the user to create, configure, and train fuzzy neural nets for inclusion within one or more virtual tools. The UI also allows the user to create, configure, and edit the configurable finite state machines that control the execution of the virtual tools.

By using a different set of data in the Electromagnetic Calculator, an alternate application is enabled which emulates the IC design process for the purpose of simulating, emulating, analyzing, optimizing, or predicting interconnect noise and/or crosstalk data during the capture phase of the design process.

By using a different set of data to train the Electromagnetic Calculator fuzzy neural nets, an alternate application is enabled providing the ability to recognize interconnect patterns within routing channels, thereby allowing the application to identify individual routes within a channel rather than the relative position of routes within a channel.

By substituting an Area Calculator virtual tool for the Electromagnetic Calculator (virtual tool), an alternate application is enabled which emulates the IC design process for the purpose of simulating, emulating, analyzing, optimizing, or predicting IC area data during the capture phase of the design process.

By substituting a Power Calculator virtual tool for the Electromagnetic Calculator (virtual) tool), an alternate application is enabled which emulates the IC design process for the purpose of simulating, emulating, analyzing, optimizing, or predicting IC power dissipation data during the capture phase of the design process.

By inserting a Circuit Synthesis virtual tool within or before the Pseudo-Placement virtual tool, an alternate application is enabled which emulates the IC design process for the purpose of simulating, emulating, analyzing, optimizing, or predicting the physical realization of language-based circuit designs during the capture phase of the design process.

Thus far, the description of the invention has focused on the use of virtual tools consisting of fuzzy neural nets to emulate the steps within the IC design process. However, the invention also supports the inclusion of discreet algorithms or entire software applications within the virtual tools in the event that sufficient data is not available to train a fuzzy neural net for the tasks required by a virtual tool, or if it is determined that an algorithmic approach to the virtual tool tasks is desirable. For example, commonly known and/or proprietary circuit partitioning, floorplanning, or placement algorithms can be integrated to perform the Pseudo Placement Function. Likewise, commonly known and/or proprietary routing algorithms can be integrated to perform the Pseudo Route Function. These commonly known and/or proprietary algorithms are integrated into the virtual tools through an application programming interface (API) provided by the invention.

In addition, the invention also allows for the results of any step within the emulated process to be output directly to the user providing information that can be used during the actual process steps. For example, the placement information generated by the Pseudo Placement Function can be used to validate and monitor the placement determined by the actual placement step.

The process of designing Printed Circuit Board (PCB) applications is very similar to the IC design process, requiring the same process steps like capture, placement, routing, and analysis, among others. By using sets of data compiled for the PCB design process to train the Pseudo Placement, Pseudo Route, and relevant Calculator virtual tools, an alternate set of applications or a single application is enabled which emulates the PCB design process for the purpose of simulating, emulating, analyzing, optimizing, or predicting interconnect noise and/or crosstalk data during the capture phase of the design process.

Additionally, the process of designing gate array, standard cell, and other application specific integrated circuits (ASICs) is the same as the IC process described in the preceding paragraphs. By using sets of data compiled for the ASIC design process to train the Pseudo Placement, Pseudo Route, and relevant Calculator virtual tools, an alternate set of applications or a single application is enabled which emulates the ASIC design process for the purpose of simulating, emulating, analyzing, optimizing, or predicting interconnect noise and/or crosstalk data during the capture phase of the design process.

Furthermore, the specifications and claims made for applications of the invention to IC and PCB design separately, lend themselves to an additional application of the invention which is to create a virtual tool which itself is composed of the two virtual tools representing the IC and PCB design virtual tools, respectively. This combined IC and PCB application emulates the IC and PCB design process for the purpose of simulating, emulating, analyzing, optimizing, or predicting IC and PCB design data during the capture phase of the design process involving both ICs and PCBs.

It also follows that by substituting virtual tools describing the mechanical design process for assemblies of PCBs onto backplanes or into cabinets (i.e. system design) for those describing IC or PCB design, an alternate application is enabled which emulates the system design process for the purpose of simulating, emulating, analyzing, optimizing, or predicting system design data during the capture phase of the mechanical system design process.

By substituting virtual tools and training data, an alternate application is enabled allowing the invention to simulate, analyze, optimize and predict the performance and other characteristics of the devices resulting from the emulated processes. By compiling training data from similar existing devices and design experiences, the fuzzy neural nets within the virtual tools can be trained to extrapolate from the existing data to predict the characteristics of the latest device. This extrapolated information is useful to managers, system designers, and marketers in the planning, costing, and scheduling of the latest device effort. For example, suppose the next generation of microprocessor is being planned. Information related to previous microprocessor design experiences is captured in the performance of the existing devices and in the costs and efforts required to complete the existing designs. Using this information to train the virtual tools will allow the virtual tools to predict the characteristics of the next generation devices, as well as to predict the required time and cost to complete the design effort.

Furthermore, the ability to predict the performance of a device or set of devices from a set of input characteristics allows the invention to be applied to the selection of catalogued devices. Given a specified set of characteristics and operating specifications, the fuzzy neural nets within the virtual tools can select the catalogued device or set of devices that reflect the desired specifications.

The applications of the invention as illustrated in FIGS. 1 through 8 and described in the preceding paragraphs emulate the IC and/or PCB design processes for the purpose of simulating, emulating, analyzing, optimizing, or predicting a variety of design criteria during the capture phase of the IC and/or PCB design process. An "iterated process" can be defined as a process iterated until data associated with the process converges to predetermined goals or objectives. Since the applications of the invention described above all involve the representation of iterated processes as a collection of virtual tools for the purpose of simulating, emulating, analyzing, optimizing, or predicting a variety of process criteria and data during the initial phase of the process, by way of induction it can be stated that a class of applications of the invention are enabled by the creation of a set of virtual tools representing a specified iterated process, thereby emulating the specified iterated process for the purpose of simulating, emulating, analyzing, optimizing, or predicting process data during the initial phase of the specified iterated process.

For example, by creating virtual tools describing the software design process for application, middleware, operating system, firmware, and/or microcode classes of software, an alternate application is enabled which emulates the software design process for the purpose of simulating, emulating, analyzing, optimizing, or predicting software design data during the initial phase of the software design process. The individual steps of the software design process are modeled as a set of virtual tools containing finite state machines and fuzzy neural nets, trained by data collected from previous software design experiences.

The invention can be described as a method of emulating a task within an iterated process, using fuzzy neural nets, by selecting input parameters and resulting output parameters for the task, then configuring a fuzzy neural net to perform a transformation of the input parameters to output parameters, then training the fuzzy neural net with historical data from previous iterations of the task that were performed previously or by other means, and executing the transformation. This procedure is essentially a functional approximation of the task.

The invention can likewise be described as a method for emulating related tasks within an iterative process, using fuzzy neural nets in combination with finite state machines, by selecting the desired said related tasks, selecting input parameters and resulting output parameters for each task, configuring a fuzzy neural net to perform a transformation of the input parameters to output parameters for each task, training each fuzzy neural net with historical data from previous iterations of the task, equating a sequence of transformations with the sequence of the related tasks, defining a finite state machine with the sequence of transformations, and performing the sequence of transformations by controlling the fuzzy neural nets with the finite state machine. This procedure is a functional approximation of the related tasks.

The invention can also be described as a method for emulating related tasks within an iterative process, using fuzzy neural nets and algorithms in combination with finite state machines, by selecting the desired related tasks within the process, selecting input parameters and resulting output parameters for each task, identifying the tasks for which there are algorithms available for generating the output parameters using the respective input parameters, designating the balance of the tasks to be emulated by use of fuzzy neural nets, configuring fuzzy neural nets to perform a transformation of the input parameters to the output parameters for these tasks, training the fuzzy neural nets with historical data from previous iterations of the respective tasks, equating a sequence of transformations and algorithms with the sequence of the selected tasks, defining a finite state machine with this sequence of transformations and algorithms, and performing the sequence by controlling the fuzzy neural nets with the finite state machine. This procedure also results in a functional approximation of the selected related tasks.

The invention can be described as a method of predicting a second set of characteristics of an integrated circuit or printed circuit board based on a given first set of characteristics, using fuzzy neural nets trained with known characteristics of other similar integrated circuits or printed circuit boards, by defining input characteristics and output characteristics from among the known characteristics of similar integrated circuits or printed circuit boards, configuring at least one fuzzy neural net to perform a functional transformation of the input characteristics to the output characteristics, training fuzzy neural nets with the known characteristics, executing functional transformations with the given first set of characteristics, thereby generating a the needed second set of characteristics.

The invention can be further described as a hierarchical adaptive system for emulating an iterated process, consisting of a pre-processor for translating input information into input data, a post processor for translating processed output data into output information, a model-free estimator for transforming input data into output data, and a tool manager consisting of a user interface and a dynamically reloadable finite state machine where the tool manager has bi-directional access to the pre-processor and the post-processor.

This system could be further configured with means for accepting input information from an end user into the user interface, such as a keyboard, means for presenting output information to an end user, such as a printer and/or display, means for control by the dynamically reloadable finite state machine, and means for self-learning through the model-free estimator.

Another variation of the invention can be discribed as a hierarchical adaptive system for emulating a process of designing integrated circuits and printed circuit boards, consisting of a tool manager, a schematic parser, a pseudo placement engine, a pseudo router, an electromagnetic translator, a schematic back annotator, and a shared information database. In this variation, the tool manager supervises and controls the storage and transfer of data; the schematic parser translates an electrical design schematic into a connectivity matrix where the electrical design schematic identifies components, properties of said components, pin connections and electrical interconnections; and the pseudo placement section determines routing channels, component size and placement using input data from said schematic parser, the tool manager, and the shared information database. The pseudo router section generates a pin-to-pin routing; the electromagnetic translator section determines electromagnetic parameters from the routing channels, the component size and placement and the pin-to-pin routing; the schematic back annotator updates the electrical design schematic with the electromagnetic parameters; and the shared information database is accessible by the pseudo router, the pseudo placement section and the electromagnetic translator, and contains integrated circuit manufacturing and design data.

The objects and advantages of the invention may be further realized and attained by means of the instrumentalities and combinations particularly pointed out in the appended claims. Accordingly, the drawing and description are to be regarded as illustrative in nature, and not as restrictive.

We claim:

1. A hierarchical adaptive system for emulating a process of designing integrated circuits and printed circuit boards comprising a tool manager, a schematic parser, a pseudo placement engine, a pseudo router, an electromagnetic translator, a schematic back annotator, and a shared information database, wherein a) said tool manager supervises and controls the storage and transfer of data, b) said schematic parser translates an electrical design schematic into a connectivity matrix wherein said electrical design schematic identifies components, properties of said components, pin connections and electrical interconnections, c) said pseudo placement section comprising fuzzy neural network determines routing channels, component size and placement using input data from said schematic parser, said tool manager, and said shared information database, d) said pseudo router section comprising fuzzy neural network generates a pin-to-pin routing, e) said electromagnetic translator section determines electromagnetic parameters from said routing channels, said component size and placement and said pin-to-pin routing, f) said schematic back annotator updates said electrical design schematic with said electromagnetic parameters, and g) said shared information database is accessible by said pseudo router, said pseudo placement section and said electromagnetic translator, and contains integrated circuit manufacturing and design data.

2. The hierarchical adaptive system of claim 1, wherein said electromagnetic parameters are selected from the group consisting of interconnect delay, crosstalk, noise, power dissipation, and size.

3. The hierarchical adaptive system of claim 1, wherein the pseudo placement section is comprised of predetermined, programmable and user-definable fuzzy neural nets.

4. The hierarchical adaptive system of claim 1, wherein the pseudo router section is comprised of several predetermined, programmable, and user-definable fuzzy neural nets from the group consisting of computational neural nets and procedural neural nets.

5. The hierarchical adaptive system of claim 1, wherein the pseudo placement section is comprised of fuzzy neural nets from the group consisting of an edge synergy fuzzy neural net, a nearest neighbor fuzzy neural net, a initial placement fuzzy neural net, a tiling fuzzy neural net, a synergy fuzzy neural net, a channel size fuzzy neural net, and a user-defined fuzzy neural net.

6. The hierarchical adaptive system of claim 1, wherein inputs to the pseudo placement section are from the group consisting of thermal dissipation, edge connectivity, connectivity, instance history, schematic proximity, synergy, place cell dominant edge, seed cell dominant edge, angle adjustment, origin of place cell, dimension of place cell, degree of overlap, current size of channel, pin count of place, place cells to channel proximity, number of routing layers, gross sort of cells.

7. The hierarchical adaptive system of claim 1, wherein outputs from the pseudo placement section is from the group consisting of gross sort of cells, synergy, relative position, polar coordinates, resolve overlaps, width of channel.

8. The hierarchical adaptive system of claim 1, wherein the shared information database is comprised of integrated circuit manufacturing data, integrated circuit design data, and data learned from a training mode.

9. The hierarchical adaptive system of claim 1, wherein the pseudo router section is comprised of several predetermined, programmable, and user-definable neural nets.

10. The hierarchical adaptive system of claim 1, wherein the pseudo router section is comprised of several predetermined, programmable, and user-definable neural nets from the group consisting of a route synergy neural net, a route criticality neural net, an initial route neural net, a route assessment neural net, a final route neural net, and a user-defined neural net.

11. The hierarchical adaptive system of claim 1, wherein inputs to the pseudo router section is from the group consisting of route synergy, synergy, route criticality, type of net, instance history, type of route, locations of pins on net, initial route, route assessment, preferred route length, normalized channels traversed, and channel density.

* * * * *